United States Patent
Na et al.

(10) Patent No.: US 10,056,415 B2
(45) Date of Patent: Aug. 21, 2018

(54) GERMANIUM-SILICON LIGHT SENSING APPARATUS

(71) Applicant: Artilux Corporation, Grand Cayman (KY)

(72) Inventors: Yun-Chung Na, Zhubei (TW); Szu-Lin Cheng, Zhubei (TW); Shu-Lu Chen, Zhubei (TW); Han-Din Liu, Sunnyvale, CA (US); Hui-Wen Chen, Zhubei (TW); Che-Fu Liang, Zhubei (TW)

(73) Assignee: Artilux Corporation, Grand Cayman (KY)

( * ) Notice: Subject to any disclaimer, the term of this patent is extended or adjusted under 35 U.S.C. 154(b) by 0 days.

(21) Appl. No.: 15/713,251

(22) Filed: Sep. 22, 2017

(65) Prior Publication Data

US 2018/0012918 A1    Jan. 11, 2018

Related U.S. Application Data

(62) Division of application No. 15/228,282, filed on Aug. 4, 2016.
(Continued)

(51) Int. Cl.
*H01L 27/146* (2006.01)
*H01L 31/0312* (2006.01)
(Continued)

(52) U.S. Cl.
CPC .... *H01L 27/14605* (2013.01); *H01L 27/1463* (2013.01); *H01L 27/1465* (2013.01);
(Continued)

(58) Field of Classification Search
CPC ......... H01L 27/14621; H01L 27/14627; H01L 27/1463; H01L 27/14649–27/14652; H01L 27/14683–27/14698
See application file for complete search history.

(56) References Cited

U.S. PATENT DOCUMENTS 4,604,527 A    8/1986    Chenevas-Paula et al.
4,607,168 A    8/1986    Oritsuki et al.
(Continued)

FOREIGN PATENT DOCUMENTS

EP    2330637    6/2011
JP    2000-133791    5/2000
(Continued)

OTHER PUBLICATIONS

International Search Report and Written Opinion in International Application No. PCT/US2016/043609, dated Nov. 1, 2016, 21 pages.
(Continued)

*Primary Examiner* — Brigitte Paterson
(74) *Attorney, Agent, or Firm* — Fish & Richardson P.C.

(57) ABSTRACT

A method for fabricating an image sensor array having a first group of photodiodes for detecting light at visible wavelengths a second group of photodiodes for detecting light at infrared or near-infrared wavelengths, the method including forming a germanium-silicon layer for the second group of photodiodes on a first semiconductor donor wafer; defining a first interconnect layer on the germanium-silicon layer; defining integrated circuitry for controlling pixels of the image sensor array on a semiconductor carrier wafer; defining a second interconnect layer on the semiconductor carrier wafer; bonding the first interconnect layer with the second interconnect layer; defining the pixels of an image sensor array on a second semiconductor donor wafer; defining a third interconnect layer on the image sensor array; and bonding the third interconnect layer with the germanium-silicon layer.

4 Claims, 22 Drawing Sheets

Related U.S. Application Data

(60) Provisional application No. 62/271,386, filed on Dec. 28, 2015, provisional application No. 62/251,691, filed on Nov. 6, 2015, provisional application No. 62/217,031, filed on Sep. 11, 2015, provisional application No. 62/211,004, filed on Aug. 28, 2015, provisional application No. 62/210,991, filed on Aug. 28, 2015, provisional application No. 62/210,946, filed on Aug. 27, 2015, provisional application No. 62/209,349, filed on Aug. 25, 2015, provisional application No. 62/200,652, filed on Aug. 4, 2015.

(51) Int. Cl.
*H01L 31/09* (2006.01)
*H01L 31/18* (2006.01)
*H01L 31/0232* (2014.01)

(52) U.S. Cl.
CPC .... *H01L 27/1469* (2013.01); *H01L 27/14621* (2013.01); *H01L 27/14627* (2013.01); *H01L 27/14632* (2013.01); *H01L 27/14634* (2013.01); *H01L 27/14636* (2013.01); *H01L 27/14645* (2013.01); *H01L 27/14649* (2013.01); *H01L 27/14685* (2013.01); *H01L 27/14687* (2013.01); *H01L 27/14689* (2013.01); *H01L 27/14698* (2013.01); *H01L 31/02327* (2013.01); *H01L 31/0312* (2013.01); *H01L 31/09* (2013.01); *H01L 31/1812* (2013.01); *H01L 31/1876* (2013.01); *H01L 31/1892* (2013.01)

(56) References Cited

U.S. PATENT DOCUMENTS

| | | | |
|---|---|---|---|
| 4,767,936 A | 8/1988 | Muakami et al. | |
| 4,782,376 A | 11/1988 | Catalano | |
| 4,926,231 A | 5/1990 | Hwang et al. | |
| 6,384,462 B1 | 5/2002 | Pauchard et al. | |
| 6,483,130 B1 | 11/2002 | Yang et al. | |
| 6,958,194 B1 | 10/2005 | Hopper | |
| 7,972,885 B1 * | 7/2011 | Dutta | B82Y 20/00 257/E21.007 |
| 9,472,588 B1 | 10/2016 | Li | |
| 9,893,112 B2 | 2/2018 | Na et al. | |
| 2003/0189159 A1 | 10/2003 | Lnoue | |
| 2004/0121507 A1 | 6/2004 | Bude et al. | |
| 2005/0077588 A1 | 4/2005 | Takashi | |
| 2005/0186759 A1 | 8/2005 | So | |
| 2005/0233495 A1 | 10/2005 | Yang et al. | |
| 2006/0289957 A1 | 12/2006 | Morse et al. | |
| 2007/0187796 A1 | 8/2007 | Conor et al. | |
| 2007/0218578 A1 | 9/2007 | Lee et al. | |
| 2007/0218580 A1 | 9/2007 | Hsu et al. | |
| 2008/0157254 A1 | 7/2008 | Kang | |
| 2008/0303058 A1 | 12/2008 | Mitsuyoshi et al. | |
| 2009/0050891 A1 | 2/2009 | Katoh | |
| 2009/0152604 A1 | 6/2009 | Zhu et al. | |
| 2009/0200589 A1 | 8/2009 | Yin et al. | |
| 2010/0078680 A1 | 4/2010 | Cheng et al. | |
| 2010/0102409 A1 | 4/2010 | Hansson | |
| 2010/0184246 A1 | 7/2010 | Sakai | |
| 2011/0155893 A1 | 6/2011 | Nobuyuki et al. | |
| 2012/0080726 A1 | 4/2012 | Yorito | |
| 2012/0248514 A1 | 10/2012 | Keisuke et al. | |
| 2013/0062522 A1 | 3/2013 | Jutao et al. | |
| 2013/0119234 A1 | 5/2013 | Yong-Jei et al. | |
| 2013/0248865 A1 | 9/2013 | Toriyama et al. | |
| 2014/0002700 A1 | 1/2014 | Oishi | |
| 2014/0054444 A1 | 2/2014 | Hiroki | |
| 2014/0252437 A1 | 9/2014 | Min-Seok et al. | |
| 2014/0285404 A1 | 9/2014 | Na et al. | |
| 2015/0041761 A1 | 2/2015 | Cheng et al. | |
| 2015/0171146 A1 | 6/2015 | Susumu et al. | |
| 2016/0027837 A1 | 1/2016 | Webster et al. | |
| 2016/0049476 A1 | 2/2016 | Rachmady et al. | |
| 2016/0172393 A1 | 6/2016 | Kim et al. | |
| 2016/0190304 A1 | 6/2016 | Morin et al. | |
| 2016/0381789 A1 | 12/2016 | Rogers et al. | |
| 2017/0025466 A1 | 1/2017 | Na et al. | |
| 2017/0040362 A1 | 2/2017 | Na et al. | |
| 2017/0062508 A1 | 3/2017 | Na et al. | |
| 2017/0075421 A1 | 3/2017 | Na et al. | |
| 2017/0084648 A1 | 3/2017 | Liu et al. | |
| 2017/0131389 A1 | 5/2017 | Na et al. | |
| 2017/0237911 A1 * | 8/2017 | Won | H04N 5/33 348/164 |
| 2018/0006081 A1 | 1/2018 | Na et al. | |
| 2018/0012916 A1 | 1/2018 | Na et al. | |
| 2018/0012917 A1 | 1/2018 | Na et al. | |

FOREIGN PATENT DOCUMENTS

| | | |
|---|---|---|
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-128024 | 6/2011 |
| JP | 2012-146920 | 8/2012 |
| JP | 2015-194838 | 11/2015 |
| WO | WO 2013-104718 | 7/2013 |
| WO | WO 2014-085789 | 6/2014 |
| WO | WO 2014-197226 | 12/2014 |
| WO | WO 2015-104307 | 7/2015 |

OTHER PUBLICATIONS

International Search Report and Written Opinion in International Application No. PCT/US2016/045526, dated Nov. 22, 2016, 15 pages.
International Search Report and Written Opinion in International Application No. PCT/US2016/048915, dated Nov. 22, 2016, 17 pages.
International Search Report and Written Opinion in International Application No. PCT/US2016/060493, dated Jan. 10, 2017, 20 pages.
International Search Report and Written Opinion in International Application No. PCT/US2016/066073, dated Mar. 7, 2017, 16 pages.
International Preliminary Report on Patentability in International Application No. PCT/US2016/043609, dated Jan. 23, 2018, 12 pages.
International Preliminary Report on Patentability in International Application No. PCT/US2016/045526, dated Feb. 6, 2018, 10 pages.
Bamji et al., "A 0.13 µm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.
Bianco et al., "A Comparative Analysis between Active and Passive Techniques for Underwater 3D Reconstruction of Close-Range Objects," Sensors, Aug. 20, 2013, 13(8):11007-11031.
Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.
Dalla Betta et al., "Design and Characterization of Current-Assisted Photonic Demodulators in 0.18-µm CMOS Technology," IEEE Trans. Electron. Dev., Jun. 2011, 58(6):1702-1709.
Feng et al., "Vertical p-i-n germanium photodetector with high external responsivity integrated with large core Si waveguides," Optics Express, Jan. 4, 2010, 18(1):96-101.
Foix et al., "Lock-in Time-of-Flight (ToF) Cameras: A Survey," IEEE Sensors J., Sep. 2011, 11(9):1917-1926.

(56) References Cited

OTHER PUBLICATIONS

Geng, "Structured-light 3D surface imaging: a tutorial," Advances in Optics and Photonics, Jun. 30, 2011, 3(2):128-160.
Joo et al., "High-sensitivity 10 Gbps Ge-on-Si photoreceiver operating at λ~1.55 μm," Optics Express, Aug. 2, 2010, 18(16):16474-16479.
Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.
Kawahito et al., "A CMOS Time-of-Flight Range Image Sensor With Gates-on-Field-Oxide Structure," IEEE Sensors J. Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron. Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
Perenzoni et al., "Compact SPAD-Based Pixel Architectures for Time-Resolved Image Sensors," Sensors, May 23, 2016, 16(5):745, 12 pages.
Rafferty et a., "Monolithic germanium SWIR imaging array," 2008 IEEE Conference on Technologies for Homeland Security, Waltham, MA, May 12, 2008, p. 577-582.
Ringbeck et al., "Multidimensional measurement by using 3-D PMD sensors," Adv. Radio Sci., Jan. 1, 2007, 5:135-146.
Tseng et al., "A self-assembled microbonded germanium/silicon heterojunction photodiode for 25 Gb/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p. waveguide photodetectors on Silicon-on-Insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):3832, 9 pages.
International Preliminary Report on Patentability in International Application No. PCT/US2016/060493, dated May 8, 2018, 11 pages.

\* cited by examiner

GERMANIUM-SILICON LIGHT SENSING APPARATUS

CROSS-REFERENCE TO RELATED APPLICATIONS

This patent application is a divisional of U.S. application Ser. No. 15/228,282, filed Aug. 4, 2016, which claims the benefit of U.S. Provisional Patent Application No. 62/200,652, filed Aug. 4, 2015, U.S. Provisional Patent Application No. 62/209,349, filed Aug. 25, 2015, U.S. Provisional Patent Application No. 62/210,946, filed Aug. 27, 2015, U.S. Provisional Patent Application No. 62/210,991, filed Aug. 28, 2015, U.S. Provisional Patent Application No. 62/211,004, filed Aug. 28, 2015, U.S. Provisional Patent Application No. 62/217,031, filed Sep. 11, 2015, U.S. Provisional Patent Application No. 62/251,691, filed Nov. 6, 2015, and U.S. Provisional Patent Application No. 62/271,386, filed Dec. 28, 2015. The disclosures of the prior applications are considered part of and are incorporated by reference in the disclosure of this application.

BACKGROUND

This specification relates to detecting light using a photodiode.

Light propagates in free space or an optical medium is coupled to a photodiode that converts an optical signal to an electrical signal for processing.

SUMMARY

A photodiode may be used to detect optical signals and convert the optical signals to electrical signals that may be further processed by another circuitry. Photodiodes may be used in consumer electronics products, image sensors, data communications, time-of-flight (TOF) applications, medical devices, and many other suitable applications. Conventionally, silicon is used as an image sensor material, but silicon has a low optical absorption efficiency for wavelengths in the near-infrared (NIR) spectrum or longer. Other materials and/or material alloys such as germanium and germanium-silicon may be used as image sensor materials with innovative optical device structure design described in this specification. According to one innovative aspect of the subject matter described in this specification, a photodiode is formed using materials such as germanium or germanium-silicon to increase the speed and/or the sensitivity and/or the dynamic range and/or the operating wavelength range of the device. In one embodiment, photodiodes formed using germanium or germanium-silicon and photodiodes formed using silicon may be integrated on a common substrate to yield a photodiode array having a greater operating wavelength range.

According to another innovative aspect of the subject matter described in this specification, light reflected from a three-dimensional object may be detected by photodiodes of an imaging system. The photodiodes convert the detected light into electrical charges. Each photodiode may include multiple gates that are controlled to collect the electrical charges. The collection of the electrical charges controlled by the multiple gates may be altered over time, such that the imaging system may determine the phase and other information of the sensed light. The imaging system may use the phase information to analyze characteristics associated with the three-dimensional object including depth information or a material composition. The imaging system may also use the phase information to analyze characteristics associated with eye-gesture recognition, body-gesture recognition, three-dimensional model scanning/video recording, and/or augmented/virtual reality applications.

In general, one innovative aspect of the subject matter described in this specification can be embodied in an image sensor array including a carrier substrate; a first group of photodiodes coupled to the carrier substrate, where the first group of photodiodes include a first photodiode, and where the first photodiode includes a semiconductor layer configured to absorb photons at visible wavelengths and to generate photo-carriers from the absorbed photons; and a second group of photodiodes coupled to the carrier substrate, where the second group of photodiodes comprise a second photodiode, and where the second photodiode comprises a germanium-silicon region fabricated on the semiconductor layer, the germanium-silicon region configured to absorb photons at infrared or near-infrared wavelengths and to generate photo-carriers from the absorbed photons.

This and other implementations can each optionally include one or more of the following features. The first group of photodiodes and the second group of photodiodes may be arranged in a two-dimensional array. Each photodiode of the first group of photodiodes and the second group of photodiodes may include a respective wavelength filter configured to transmit a portion of received light and a respective lens element configured to focus the received light.

The first photodiode may include a first carrier-collection region configured to collect a portion of the photo-carriers generated by the semiconductor layer; a first readout region coupled to a first readout circuitry, the first readout region configured to provide the photo-carriers collected by the first carrier-collection region to the first readout circuitry; and a first gate coupled to a first control signal that controls a carrier transport between the first carrier-collection region and the first readout region. The second photodiode may include a second carrier-collection region configured to collect a portion of the photo-carriers generated by the germanium-silicon region; a second readout region coupled to a second readout circuitry, the second readout region configured to provide the photo-carriers collected by the second carrier-collection region to the second readout circuitry; and a second gate coupled to a second control signal that controls a carrier transport between the second carrier-collection region and the second readout region.

The second photodiode may include a third readout region coupled to a third readout circuitry, the third readout region configured to provide the photo-carriers collected by the second carrier-collection region to the third readout circuitry; and a third gate coupled to a third control signal that controls a carrier transport between the second carrier-collection region and the third readout region. The second photodiode may include a fourth readout region coupled to a fourth readout circuitry, the fourth readout region configured to provide the photo-carriers collected by the second carrier-collection region to the fourth readout circuitry; and a fourth gate coupled to a fourth control signal that controls a carrier transport between the second carrier-collection region and the fourth readout region. The second photodiode may include a fifth readout region coupled to a fifth readout circuitry, the fifth readout region configured to provide the photo-carriers collected by the second carrier-collection region to the fifth readout circuitry; and a fifth gate coupled to a fifth control signal that controls a carrier transport between the second carrier-collection region and the fifth readout region. The first gate may be for an image sensing application, and at least two gates of the second gate, the third gate, the fourth gate, and the fifth gate may be for a time-of-flight application.

The first carrier-collection region may include a p-n junction and the second carrier-collection region may include a p-i-n junction configured to collect electrons. The first readout region and the second readout region may be n-doped regions.

The image sensor array may include an oxide layer planarized across the first group of photodiodes and the second group of photodiodes, where the germanium-silicon region is embedded in the oxide layer. The first photodiode may be configured to collect electrons and the second photodiode may be configured to collect holes.

Another innovative aspect of the subject matter described in this specification can be embodied in a method for fabricating an image sensor array having a first group of photodiodes for detecting light at visible wavelengths a second group of photodiodes for detecting light at infrared or near-infrared wavelengths, the method including growing a germanium-silicon layer on a semiconductor donor wafer; defining pixels of the image sensor array on the germanium-silicon layer; after defining the pixels of the image sensor array, defining a first interconnect layer on the germanium-silicon layer, where the interconnect layer includes a plurality of interconnects coupled to the first group of photodiodes and the second group of photodiodes; defining integrated circuitry for controlling the pixels of the image sensor array on a semiconductor carrier wafer; after defining the integrated circuitry, defining a second interconnect layer on the semiconductor carrier wafer, where the second interconnect layer includes a plurality of interconnects coupled to the integrated circuitry; and bonding the first interconnect layer with the second interconnect layer, such that the first group of photodiodes and the second group of photodiodes are coupled to the integrated circuitry.

This and other implementations can each optionally include one or more of the following features. The method may include removing at least a portion of the semiconductor donor wafer through polishing. The method may include forming lens elements on the semiconductor donor wafer, where each of the lens elements may be arranged to guide light to a respective photodiode of the image sensor array. The method may include forming wavelength filters on the image sensor array, where each of the wavelength filters may be formed for a respective photodiode of the image sensor array.

Another innovative aspect of the subject matter described in this specification can be embodied in a method for fabricating an image sensor array having a first group of photodiodes for detecting light at visible wavelengths a second group of photodiodes for detecting light at infrared or near-infrared wavelengths, the method including defining pixels of an image sensor array on a semiconductor donor wafer; depositing an insulating layer on the semiconductor donor wafer; defining, on the insulating layer, regions for the second group of photodiodes; growing a germanium-silicon layer on the regions for the second group of photodiodes; after growing the germanium-silicon layer, defining a first interconnect layer, where the interconnect layer includes a plurality of interconnects coupled to the first group of photodiodes and the second group of photodiodes; defining integrated circuitry for controlling the pixels of the image sensor array on a semiconductor carrier wafer; after defining the integrated circuitry, defining a second interconnect layer on the semiconductor carrier wafer, where the second interconnect layer includes a plurality of interconnects coupled to the integrated circuitry; and bonding the first interconnect layer with the second interconnect layer, such that the first group of photodiodes and the second group of photodiodes are coupled to the integrated circuitry.

This and other implementations can each optionally include one or more of the following features. To grow the germanium-silicon layer on the regions for the second group of photodiodes, the germanium-silicon layer may be formed by a selective epitaxial growth, such that the germanium-silicon layer is embedded in the insulating layer; and the germanium-silicon layer may be polished to planarize the insulating layer and the germanium-silicon layer. The method may include removing at least a portion of the semiconductor donor wafer through polishing.

The method may further include forming lens elements on the semiconductor donor wafer, where each of the lens elements is arranged to guide light to a respective photodiode of the image sensor array, and forming wavelength filters on the image sensor array, each of the wavelength filters formed for a respective photodiode of the image sensor array.

Another innovative aspect of the subject matter described in this specification can be embodied in a method for fabricating an image sensor array having a first group of photodiodes for detecting light at visible wavelengths a second group of photodiodes for detecting light at infrared or near-infrared wavelengths, the method including forming a germanium-silicon layer for the second group of photodiodes on a first semiconductor donor wafer; defining a first interconnect layer on the germanium-silicon layer, where the interconnect layer includes a plurality of interconnects coupled to the first group of photodiodes and the second group of photodiodes; defining integrated circuitry for controlling pixels of the image sensor array on a semiconductor carrier wafer; after defining the integrated circuitry, defining a second interconnect layer on the semiconductor carrier wafer, where the second interconnect layer includes a plurality of interconnects coupled to the integrated circuitry; bonding the first interconnect layer with the second interconnect layer; defining the pixels of an image sensor array on a second semiconductor donor wafer; after defining the pixels of the image sensor array, defining a third interconnect layer on the image sensor array; and bonding the third interconnect layer with the germanium-silicon layer, such that the first group of photodiodes and the second group of photodiodes are coupled to the integrated circuitry.

This and other implementations can each optionally include one or more of the following features. The method may further include after bonding the first interconnect layer with the second interconnect layer, removing the first semiconductor donor wafer. To form the germanium-silicon layer for the second group of photodiodes on the first semiconductor donor wafer, a blanket layer of germanium-silicon may be grown on the first semiconductor donor wafer. The method may include after bonding the first interconnect layer with the second interconnect layer, defining regions for at least the second group of photodiodes on the germanium-silicon layer.

To form the germanium-silicon layer for the second group of photodiodes on the first semiconductor donor wafer, an insulating layer may be deposited on the semiconductor donor wafer. Regions for the second group of photodiodes may be defining on the insulating layer. A germanium-silicon layer may be grown on the regions for the second group of photodiodes.

Advantageous implementations may include one or more of the following features. Germanium is an efficient absorption material for near-infrared wavelengths, which reduces the problem of slow photo-carriers generated at a greater substrate depth when an inefficient absorption material, e.g., silicon, is used. An increased device bandwidth allows the use of a higher modulation frequency in an optical sensing system, giving advantages such as a greater depth resolution. An alloy germanium-silicon material as the optical absorption layer with innovative design provides higher optical absorption efficiency over conventional Si material, which may provide a more sensitive sensor in the visible and near-infrared spectrums, may reduce crosstalk between neighboring pixels, and may allow for a reduction of pixel sizes. A hybrid sensor design may support time-of-flight (TOF), near-infrared, and visible image sensing within the same sensing array. An increased device bandwidth allows the use of a higher modulation frequency in a time-of-flight system, giving a greater depth resolution. In a time-of-flight system where the peak intensity of optical pulses is increased while the duty cycle of the optical pulses is decreased, the signal-to-noise ratio can be improved while maintaining substantially the same power consumption for the time-of-flight system. This is made possible when the device bandwidth is increased so that the duty cycle of the optical pulses can be decreased without distorting the pulse shape.

The details of one or more implementations are set forth in the accompanying drawings and the description below. Other potential features and advantages will become apparent from the description, the drawings, and the claims.

BRIEF DESCRIPTION OF THE DRAWINGS

Like reference numbers and designations in the various drawings indicate like elements. It is also to be understood that the various exemplary embodiments shown in the figures are merely illustrative representations and are not necessarily drawn to scale.

DETAILED DESCRIPTION

Photodiodes may be used to detect optical signals and convert the optical signals to electrical signals that may be further processed by another circuitry. In general, a material absorbs light at various wavelengths to generate free carriers depending on an energy bandgap associated with the material. For example, at room temperature, silicon may have an energy bandgap of 1.12 eV, germanium may have an energy bandgap of 0.66 eV, and a germanium-silicon alloy may have an energy bandgap between 0.66 eV and 1.12 eV depending on the composition. In general, a material having a lower energy bandgap has a higher absorption coefficient at a particular wavelength. If the absorption coefficient of a material is too low, the optical signal cannot be converted to an electrical signal efficiently. However, if the absorption coefficient of a material is too high, free carriers will be generated near the surface of the material, which may be recombined to reduce efficiency. Silicon is not an efficient sensor material for NIR wavelengths due to its large bandgap. On the other hand, germanium has an absorption coefficient that may be too high for shorter wavelengths (e.g., blue), where free carriers may recombine at the surface. A photodiode array that integrates silicon and germanium/germanium-silicon on a common substrate, where a photodiode array uses silicon to detect visible light and uses germanium or germanium-silicon to detect NIR light, would enable the photodiode array to have a wide detection spectrum. In this application, the term "photodiode" may be used interchangeably as the term "optical sensor". In this application, the term "germanium-silicon (GeSi)", "silicon-germanium (SiGe)" may be used interchangeably, and both include all suitable SiGe composition combinations from 100% germanium (Ge) to more than 90% silicon (Si). In this application, the GeSi layer may be formed using blanket epitaxy, selective epitaxy, or other applicable technique. Furthermore, a strained super lattice structure including multiple layers such as alternating SiGe layer with different compositions may be used for the absorption or forming a quantum well structure.

Figure 1:
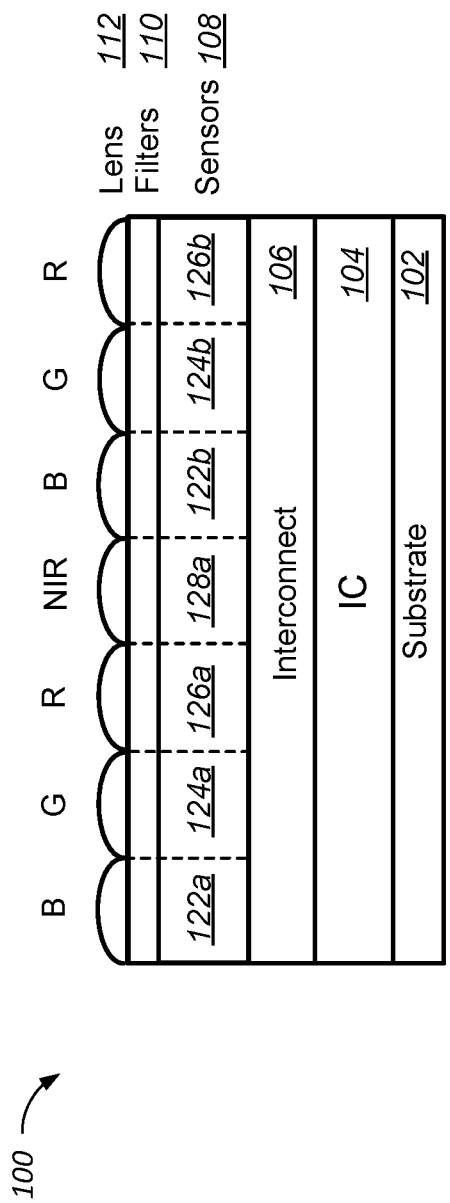
FIG. 1 is an example of a photodiode array.

FIG. 1 is an example a photodiode array 100 where germanium or germanium-silicon photodiodes are integrated with silicon photodiodes. An optical image sensor array is an example of a photodiode array. The photodiode array 100 includes a substrate 102, an integrated circuit layer 104, an interconnect layer 106, a sensor layer 108, a filter layer 110, and a lens layer 112. In general, light of a single wavelength or multiple wavelengths enters the lens layer 112, where the light may be focused, collimated, expanded, or processed according to the lens design. The light then enters the filter layer 110, where the filter layer 110 may be configured to pass light having a specific wavelength range. The photodiodes in the sensor layer 108 converts the incident light into free carriers. The integrated circuit layer 104 collects the free carriers through the interconnect layer 106 and processes the free carriers according to the specific application.

In general, the substrate 102 may be a silicon substrate, a silicon-on-insulator (SOI) substrate, or any other suitable carrier substrate materials. The integrated circuits of the integrated circuit layer 104 and the interconnects of the interconnect layer 106 may be fabricated using CMOS processing techniques. For example, the interconnects may be formed by dry-etching a contact hole through a dielectric layer and filling the contact hole by a copper using chemical vapor deposition (CVD). Furthermore, the shape of the lens could be concave, convex, planar with surface structure, or other shapes, and its shape should not be limited by the exemplary drawings here.

The sensor layer 108 includes multiple groups of photodiodes for detecting light of different wavelength ranges. For example, a group of photodiodes that includes photodiodes 122a, 122b, and others not shown in this figure may be configured to detect light of a blue wavelength range (e.g., 460 nm±40 nm). As another example, a group of photodiodes that includes photodiodes 124a, 124b, and others not shown in this figure may be configured to detect light of a green wavelength range (e.g., 540 nm ±40 nm). As another example, a group of photodiodes that includes photodiodes 126a, 126b, and others not shown in this figure may be configured to detect light of a red wavelength range (e.g., 620 nm±40 nm). As another example, a group of photodiodes that includes photodiode 128a and others not shown in this figure may be configured to detect light of a NIR wavelength range (e.g., 850 nm±40 nm, 940 nm±40 nm, or >1 μm). Each photodiode may be isolated by insulating sidewall spacers, trenches, or other suitable isolation structures.

In some implementations, the wavelength range that a photodiode is configured to detect may be controlled by an optical filter in the filter layer 110. For example, the photodiode 126a is configured to receive a red wavelength range, where the center wavelength and the limits of the wavelength range are controlled by the characteristics of the filter above the photodiode 126a. A filter may be formed by depositing layers of dielectric materials, such that light having a wavelength within a specific wavelength range would pass through the filter and light having a wavelength outside the specific wavelength range would be reflected by the filter. A filter may also be formed by forming a layer of a material on the photodiode, such that light having a wavelength within a specific wavelength range would pass through the filter and light having a wavelength outside the specific wavelength range would be absorbed by the filter. For example, a silicon layer may be formed on a germanium-silicon photodiode, where the silicon layer absorbs visible light but is transparent to NIR light.

In some implementations, the wavelength range that a photodiode is configured to detect may be controlled by a material composition of the photodiode. For example, an increase in germanium composition in a germanium-silicon alloy may increase the sensitivity of the photodiode at longer wavelengths. In some implementations, the wavelength range that a photodiode is configured to detect may be controlled by a combination of the optical filter and the material composition of the photodiode.

In some implementations, the groups of photodiodes that are configured to detect visible light (e.g., red, green, and blue) may be silicon photodiodes, while the group of photodiodes that are configured to detect NIR light may be germanium photodiodes or germanium-silicon photodiodes.

In some other implementations, one or more groups of photodiodes that are configured to detect visible light (e.g., green and blue) may be silicon photodiodes, while one or more other groups of photodiodes that are configured to detect visible light (e.g., red) and the group of photodiodes that are configured to detect NIR light may be germanium photodiodes or germanium-silicon photodiodes. For example, the group of photodiodes that detect red light may be germanium-silicon photodiodes having a lower germanium concentration than the germanium-silicon photodiodes in the group of photodiodes that detect NIR light. In some implementations, the germanium concentration may range from 10% to 100%. As another example, the group of photodiodes that detect red light may be germanium-silicon photodiodes having a different thickness from the germanium-silicon photodiodes in the group of photodiodes that detect NIR light.

Figure 2:
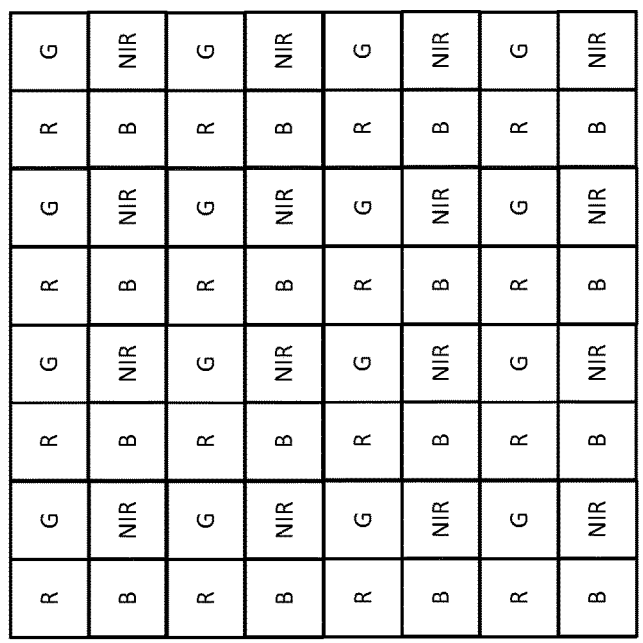
FIG. 2 is an example of a photodiode array.

FIG. 2 is an example photodiode array 200 that shows a top view of a two-dimensional photodiode array, where germanium or germanium-silicon photodiodes are integrated with silicon photodiodes. The photodiodes in the photodiode array 200 are similar to the photodiodes described in the photodiode array 100. The photodiodes of the photodiode array 200 are arranged as pixels. In some implementations, silicon photodiodes are formed as pixels for detecting visible light, and germanium or germanium-silicon photodiodes are embedded in the silicon as pixels for detecting NIR light. In some other implementations, silicon photodiodes are formed as pixels for detecting blue and green light, and germanium or germanium-silicon photodiodes are embedded in the silicon as pixels for detecting red and NIR light.

Figure 3:
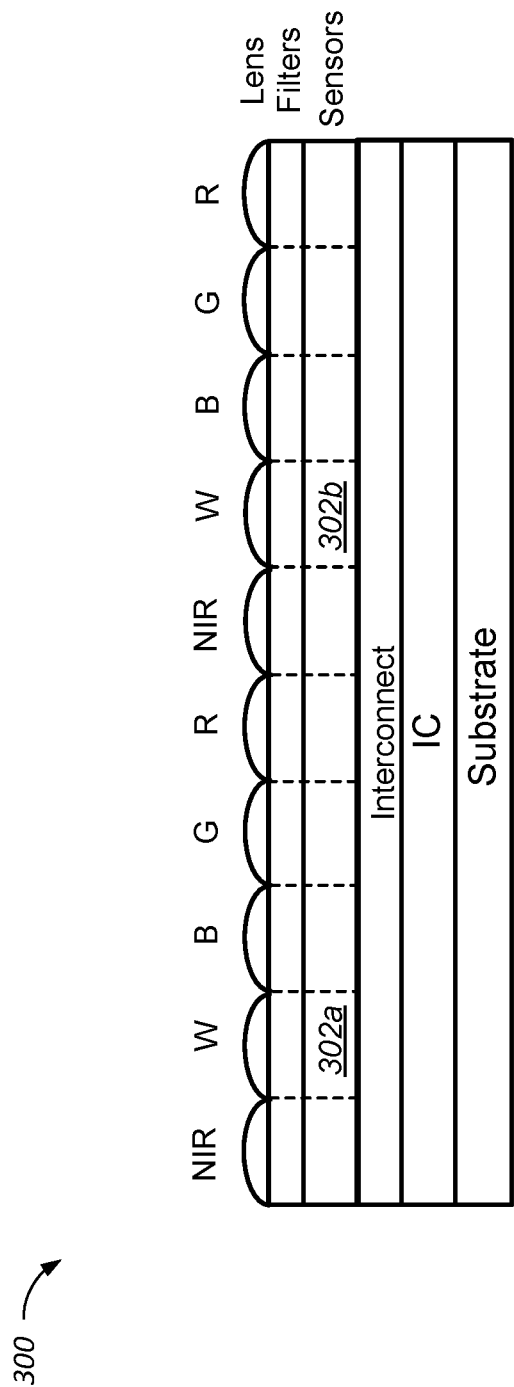
FIG. 3 is an example of a photodiode array.

FIG. 3 is an example photodiode array 300, where germanium or germanium-silicon photodiodes are integrated with silicon photodiodes. The photodiodes in the photodiode array 300 are similar to the photodiodes described in the photodiode array 100. In addition, the photodiode array 300 includes a group of photodiodes 302a, 302b, and others not shown in this figure that are configured to detect light of a white wavelength range (e.g., 420 nm to 660 nm). In some implementations, the photodiodes 302a and 302b may be silicon photodiodes. In some other implementations, the photodiodes 302a and 302b may be germanium or germanium-silicon photodiodes to improve the overall light absorption of the diodes. For example, the group of photodiodes that detect white light may be germanium-silicon photodiodes having a lower germanium concentration than the germanium-silicon photodiodes in the group of photodiodes that detect NIR light. As another example, the group of photodiodes that detect white light may be germanium-silicon photodiodes having a different thickness from the germanium-silicon photodiodes in the group of photodiodes that detect NIR light.

Figure 4A:
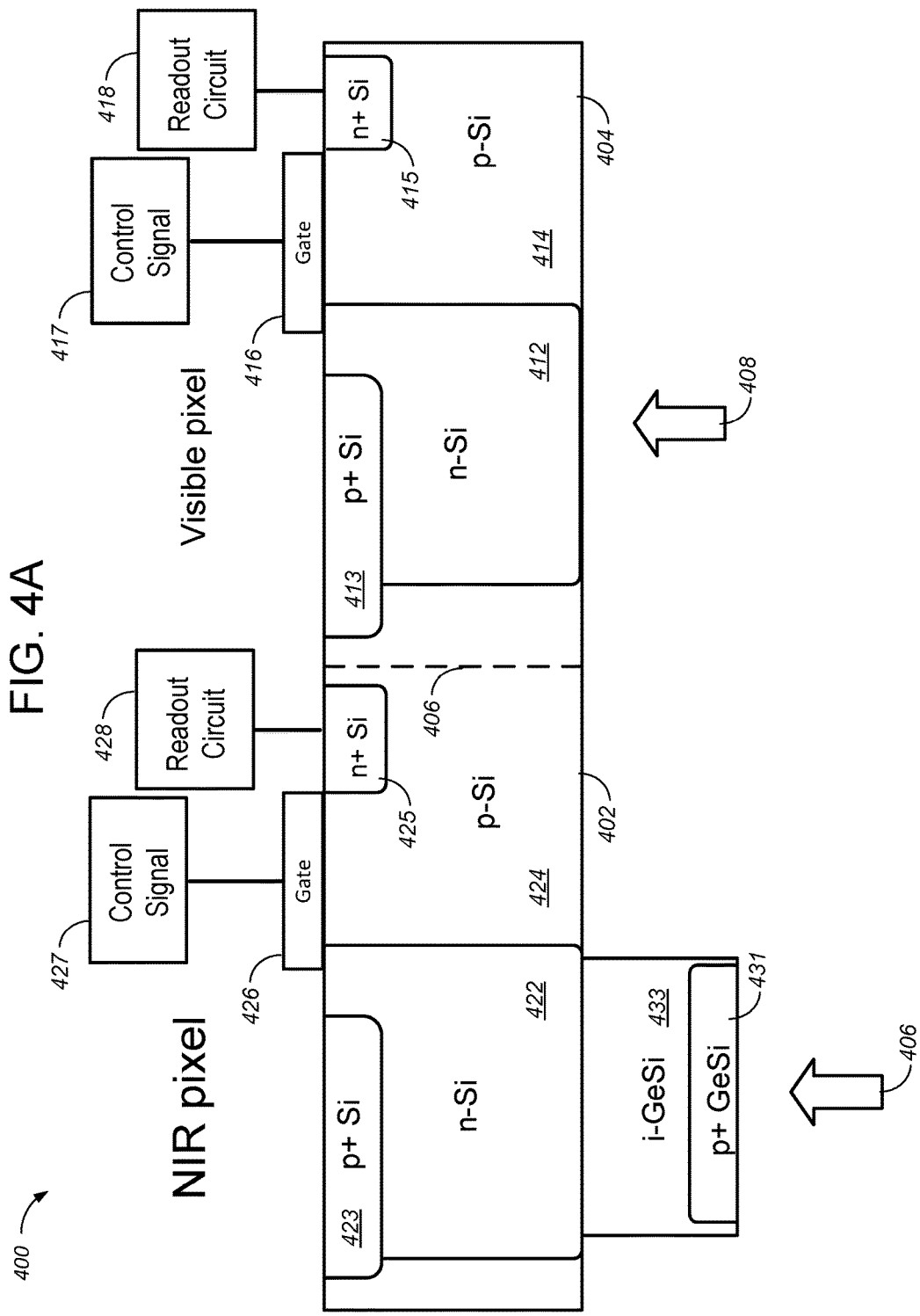
FIGS. 4A and 4B are examples of a photodiode for detecting visible and infrared light.

FIG. 4A illustrates example photodiodes 400 for detecting visible and infrared optical signals. The example photodiodes 400 includes an NIR pixel 402 and a visible pixel 404 that are formed on a common substrate. The NIR pixel 402 and the visible pixel 404 are separated by an isolation structure 406. The NIR pixel 402 is configured to detect an optical signal having a wavelength in the NIR range. The visible pixel 404 is configured to detect an optical signal having a wavelength in the visible range (e.g., blue and/or green and/or red). The NIR pixel 402 and the visible pixel 404 may be photodiodes in the sensor layer 108 as described in reference to FIG. 1, for example.

The visible pixel 404 includes an n-Si region 412, a p+ Si region 413, a p-Si region 414, an n+ Si region 415, a first gate 416, a first control signal 417 coupled to the first gate 416, and a readout circuit 418 coupled to the n+ Si region 415. The n-Si region 412 may be lightly doped with an n-dopant, e.g., about $10^{16}$ cm$^{-3}$ with phosphorus. The p+ Si region 413 may have a p+ doping, where the activated dopant concentration is as high as a fabrication process may achieve, e.g., about $5 \times 10^{20}$ cm$^{-3}$ with boron. The p-Si region 414 may be lightly doped with a p-dopant, e.g., about $10^{15}$ cm$^{-3}$ with boron. The n+ Si region 415 may have an n+ doping, where the activated dopant concentration is as high as a fabrication process may achieve, e.g., about $5 \times 10^{20}$ cm$^{-3}$ with phosphorous.

In general, the n-Si layer 412 receives an optical signal 408 and converts the optical signal 408 into electrical signals. The optical signal 408 enters the n-Si region 412, where the n-Si region 412 absorbs the optical signal 408 and converts the absorbed light into free carriers. In some implementations, the optical signal 408 may be filtered by a wavelength filter not shown in this figure, such as a filter in the filter layer 110 as described in reference to FIG. 1. In some implementations, a beam profile of the optical signal 408 may be shaped by a lens not shown in this figure, such as a lens in the lens layer 112 as described in reference to FIG. 1.

In general, a difference between the Fermi level of the p+ Si region 413 and the Fermi level of the n-Si region 412 creates an electric field between the two regions, where free electrons generated by the n-Si region 412 are drifted to a region below the p+ Si region 413 by the electric field. The first gate 416 may be coupled to the first control signal 417. For example, the first gate 416 may be coupled to a voltage source, where the first control signal 417 may be a DC voltage signal from the voltage source. The first control signal 417 controls a flow of free electrons from the region below the p+ Si region 413 to the n+ Si region 415. For example, if a voltage of the control signal 417 exceeds a threshold voltage, free electrons accumulated in the region below the p+ Si region 413 will drift to the n+ Si region 415.

The n+ Si region 415 may be coupled to the first readout circuit 418. The first readout circuit 418 may be in a three-transistor configuration consisting of a reset gate, a source-follower, and a selection gate, or any suitable circuitry for processing free carriers. In some implementations, the first readout circuit 418 may be fabricated on a substrate that is common to the visible pixel 404. For example, the first readout circuit 418 may be fabricated on the integrated circuit layer 104 as described in reference to FIG. 1. In some other implementations, the first readout circuit 418 may be fabricated on another substrate and co-packaged with the visible pixel 404 via die/wafer bonding or stacking.

The NIR pixel 402 includes an n-Si region 422, a p+ Si region 423, a p-Si region 424, an n+ Si region 425, a second gate 426, a second control signal 427 coupled to the second gate 426, a second readout circuit 428 coupled to the n+ Si region 425, a p+ GeSi region 431, and an intrinsic GeSi region 433. The n-Si region 422 may be lightly doped with an n-dopant, e.g., about $10^{16}$ cm$^{-3}$ with phosphorus. The p+ Si region 423 may have a p+ doping, where the activated dopant concentration is as high as a fabrication process may achieve, e.g., about $5 \times 10^{16}$ cm$^{-3}$ with boron. The p-Si region 424 may be lightly doped with a p-dopant, e.g., about $10^{15}$ cm$^{-3}$ with boron. The n+ Si region 425 may have an n+ doping, where the activated dopant concentration is as high as a fabrication process may achieve, e.g., about $5 \times 10^{16}$ cm$^{-3}$ with phosphorous.

In general, the intrinsic GeSi region 433 receives an optical signal 406 and converts the optical signal 406 into electrical signals. In some implementations, the optical signal 406 may be filtered by a wavelength filter not shown in this figure, such as an NIR filter in the filter layer 110 as described in reference to FIG. 1. In some implementations, a beam profile of the optical signal 406 may be shaped by a lens not shown in this figure, such as a lens in the lens layer 112 as described in reference to FIG. 1.

In some implementations, a thickness of the intrinsic GeSi region 433 may be between 0.05 μm to 2 μm. In some implementations, the intrinsic GeSi region 433 may include a p+ GeSi region 431. The p+ GeSi region 431 may repel the photo-electrons away from the intrinsic GeSi region 433 to avoid surface recombination and thereby may increase the carrier collection efficiency. For example, the p+ GeSi region 431 may have a p+ doping, where the dopant concentration is as high as a fabrication process may achieve, e.g., about $5 \times 10^{16}$ cm$^{-3}$ when the intrinsic GeSi region 433 is germanium and doped with boron.

The generated free carriers in the intrinsic GeSi region 433 may drift or diffuse into the n-Si region 422. In general, a difference between the Fermi level of the p+ Si region 423 and the Fermi level of the n-Si region 422 creates an electric field between the two regions, where free electrons collected from the intrinsic GeSi region 433 by the n-Si region 422 are drifted to a region below the p+ Si region 423 by the electric field. The second gate 426 may be coupled to the second control signal 427. For example, the second gate 426 may be coupled to a voltage source, where the second control signal 427 may be a DC voltage signal from the voltage source. The second control signal 427 controls a flow of free electrons from the region below the p+ Si region 423 to the n+ Si region 425. For example, if a voltage of the second control signal 427 exceeds a threshold voltage, free electrons accumulated in the region below the p+ Si region 423 will drift to the n+ Si region 425. The n+ Si region 425 may be coupled to the second readout circuit 428. The second readout circuit 428 may be similar to the first readout circuit 418.

Although not shown in FIG. 4A, in some other implementations, the visible pixel 404 and the NIR pixel 402 may alternatively be fabricated to collect holes instead of electrons. In this case, the p+ Si regions 413 and 423 would be replaced by n+ Si regions, the n-Si regions 412 and 413 would be replaced by p-Si regions, the p-Si regions 414 and 424 would be replaced by n-Si regions, and the n+ Si region 415 and 425 would be replaced by p+ Si regions. Note that the drawings shown here are for illustration and working principle explanation purpose.

Figure 4B:
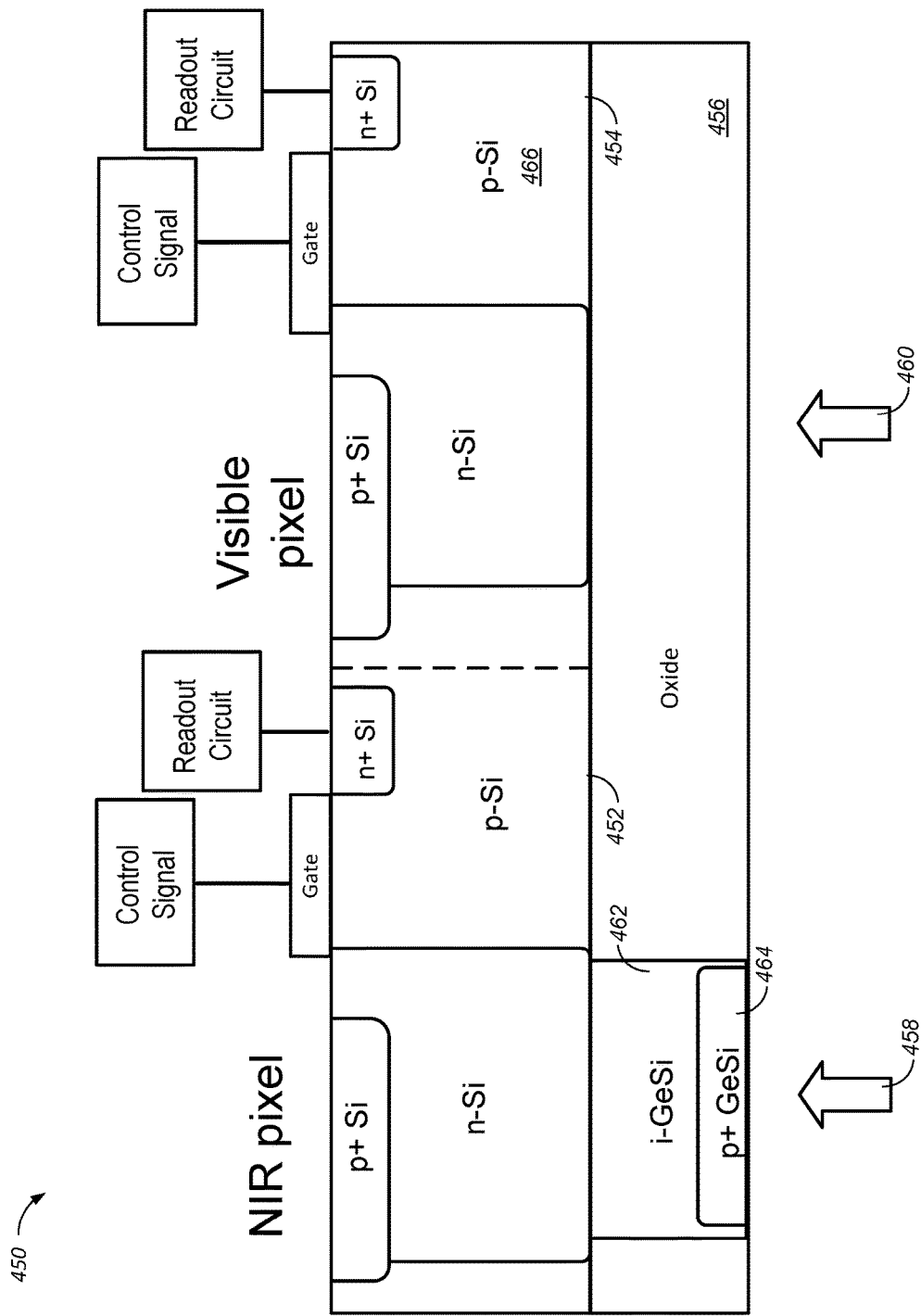

FIG. 4B illustrates example photodiodes 450 for detecting visible and infrared optical signals. The photodiodes 450 includes a visible pixel 454 and an NIR pixel 452. The visible pixel 454 is similar to the visible pixel 404 as described in reference to FIG. 4A. The NIR pixel 452 is similar to the NIR pixel 402 as described in reference to FIG. 4A. Here, the surface of the visible pixel 454 and the NIR pixel 452 that receive optical signals 458 and 460 is a planarized surface, where the intrinsic GeSi region 462 and the p+ GeSi region 464 are embedded in an oxide layer 456. For example, the oxide layer 456 may be formed on the p-Si region 466. A thickness of the oxide layer 456 may be selected to be the thickness of the intrinsic GeSi region 462. A sensor region may be formed in the oxide layer 456 by etching or any other suitable techniques. Germanium-silicon may be selectively grown in the sensor region to form the intrinsic GeSi region 462. A planarized surface between the visible pixel 454 and the NIR pixel 452 enables additional processing on the photodiode surface and/or bonding with devices fabricated on a separate substrate.

Figure 5:
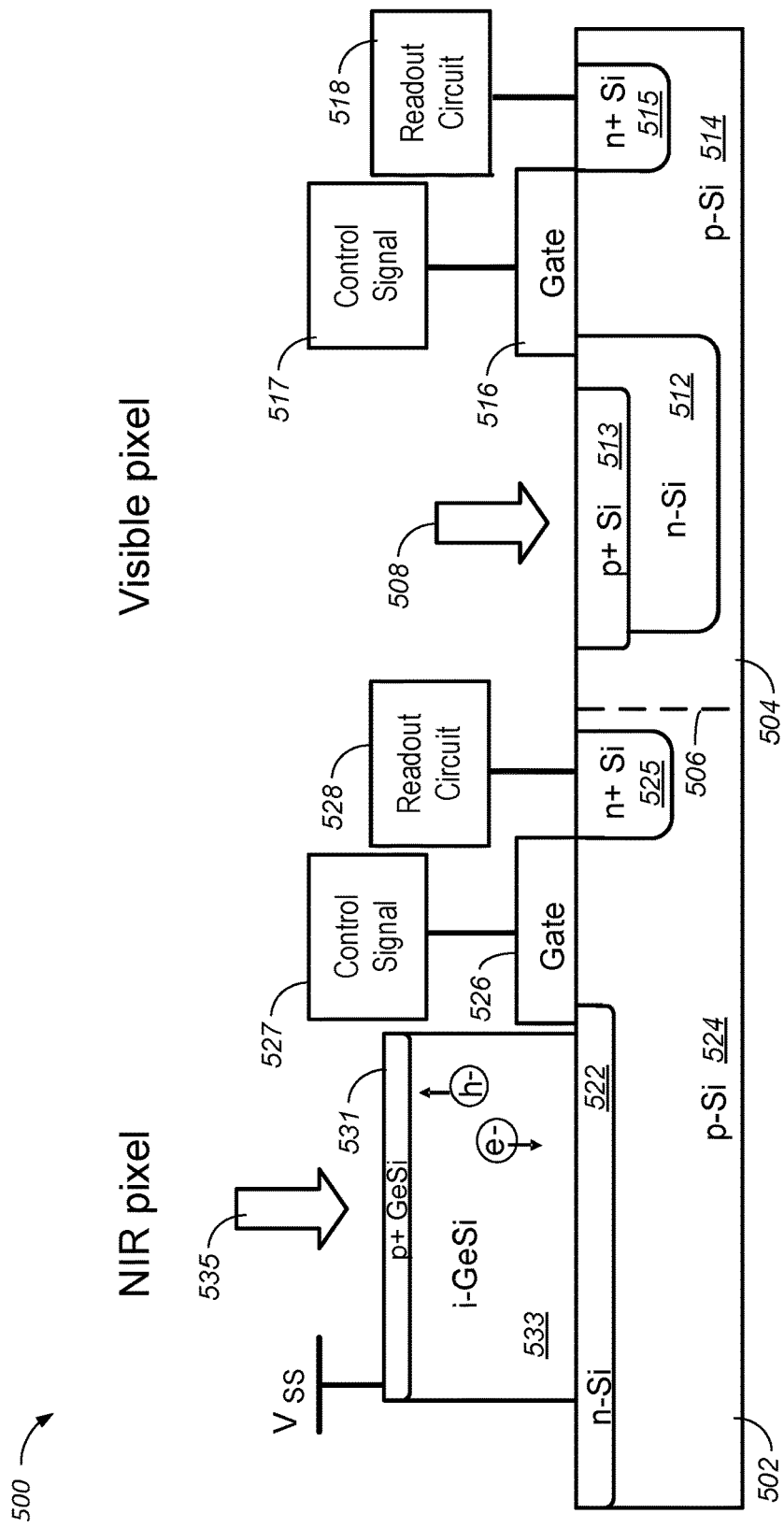
FIG. 5 is an example of a photodiode for detecting visible and infrared light.

FIG. 5 illustrates example photodiodes 500 for detecting visible and infrared optical signals. The example photodiodes 500 includes an NIR pixel 502 and a visible pixel 504 that are formed on a common substrate. The NIR pixel 502 and the visible pixel 504 are separated by an isolation structure 506. The NIR pixel 502 is configured to detect an optical signal having a wavelength in the NIR range. The visible pixel 504 is configured to detect an optical signal having a wavelength in the visible range (e.g., blue and/or green and/or red). The NIR pixel 502 and the visible pixel 504 may be photodiodes in the sensor layer 108 as described in reference to FIG. 1, for example.

The visible pixel 504 includes an n-Si region 512, a p+ Si region 513, a p-Si region 514, an n+ Si region 515, a first gate 516, a first control signal 517 coupled to the first gate 516, and a readout circuit 518 coupled to the n+ Si region 515. The n-Si region 512 may be lightly doped with an n-dopant, e.g., about $10^{16}$ cm$^{-3}$ with phosphorus. The p+ Si region 513 may have a p+ doping, where the activated dopant concentration is as high as a fabrication process may achieve, e.g., about $5\times10^{16}$ cm$^{-3}$ with boron. The p-Si region 514 may be lightly doped with a p-dopant, e.g., about $10^{15}$ cm$^{-3}$ with boron. The n+ Si region 515 may have an n+ doping, where the activated dopant concentration is as high as a fabrication process may achieve, e.g., about $5\times10^{20}$ cm$^{-3}$ with phosphorous.

In general, the p+ Si layer 513 receives an optical signal 508. Since the thickness of the p+ Si layer 513 is generally thin (e.g., 100 nm), the optical signal 508 propagates into the n-Si region 512, where the n-Si region 512 absorbs the optical signal 508 and converts the optical signal 508 into free carriers. In some implementations, the optical signal 508 may be filtered by a wavelength filter not shown in this figure, such as a filter in the filter layer 110 as described in reference to FIG. 1. In some implementations, a beam profile of the optical signal 508 may be shaped by a lens not shown in this figure, such as a lens in the lens layer 112 as described in reference to FIG. 1.

In general, a difference between the Fermi level of the p+ Si region 513 and the Fermi level of the n-Si region 512 creates an electric field between the two regions, where free electrons generated by the n-Si region 512 are drifted to a region below the p+ Si region 513 by the electric field. The first gate 516 may be coupled to the first control signal 517. For example, the first gate 516 may be coupled to a voltage source, where the first control signal 517 may be a DC voltage signal from the voltage source. The first control signal 517 controls a flow of free electrons from the region below the p+ Si region 513 to the n+ Si region 515. For example, if a voltage of the control signal 517 exceeds a threshold voltage, free electrons accumulated in the region below the p+ Si region 513 will drift to the n+ Si region 515 for collection. The n+ Si region 515 may be coupled to the first readout circuit 518 that processes the collected electrical signal. The first readout circuit 518 may be similar to the first readout circuit 418 as described in reference to FIG. 4A.

The NIR pixel 502 includes an n-Si region 522, a p-Si region 524, an n+ Si region 525, a second gate 526, a second control signal 527 coupled to the second gate 526, a second readout circuit 528 coupled to the n+ Si region 525, a p+ GeSi region 531, and an intrinsic GeSi region 533. The n-Si region 522 may be lightly doped with an n-dopant, e.g., about $10^{16}$ cm$^{-3}$ with phosphorus. The p-Si region 524 may be lightly doped with a p-dopant, e.g., about $10^{15}$ cm$^{-3}$ with boron. The n+ Si region 525 may have an n+ doping, where the activated dopant concentration is as high as a fabrication process may achieve, e.g., about $5\times10^{16}$ cm$^{-3}$ with phosphorous.

The p+ GeSi region 531 receives an optical signal 535 and converts the optical signal 406 into electrical signals. Since the thickness of the p+ GeSi layer 531 is generally thin (e.g., 100 nm), the optical signal 535 propagates into the intrinsic GeSi region 533, where the intrinsic GeSi region 533 absorbs the optical signal 535 and converts the optical signal 535 into free carriers. In some implementations, the optical signal 535 may be filtered by a wavelength filter not shown in this figure, such as an NIR filter in the filter layer 110 as described in reference to FIG. 1. In some implementations, a beam profile of the optical signal 535 may be shaped by a lens not shown in this figure, such as a lens in the lens layer 112 as described in reference to FIG. 1.

In some implementations, a thickness of the intrinsic GeSi region 533 may be between 0.05 µm to 2 µm. In some implementations, the p+ GeSi region 531 may repel the photo-electrons away from the intrinsic GeSi region 533 to avoid surface recombination and thereby may increase the carrier collection efficiency. For example, the p+ GeSi region 531 may have a p+ doping, where the dopant concentration is as high as a fabrication process may achieve, e.g., about $5\times10^{20}$ cm$^{-3}$ when the intrinsic GeSi region 533 is germanium and doped with boron.

The generated free carriers in the intrinsic GeSi region 533 may drift or diffuse into the n-Si region 522. In some implementations, a source supply voltage Vss may be applied to the NIR pixel 502 to create an electric field between the p+ GeSi region 531 and the n-Si region 522, such that the free electrons may drift towards the n-Si region 522 while the free holes may drift towards the p+ GeSi region 531.

The second gate 526 may be coupled to the second control signal 527. For example, the second gate 526 may be coupled to a voltage source, where the second control signal 527 may be a DC voltage signal from the voltage source. The second control signal 527 controls a flow of free electrons from the n-Si region 522 to the n+ Si region 525. For example, if a voltage of the second control signal 527 exceeds a threshold voltage, free electrons accumulated in the n-Si region 522 will drift towards the n+ Si region 525. The n+ Si region 525 may be coupled to the second readout circuit 528 for further processing of the collected electrical signal. The second readout circuit 528 may be similar to the first readout circuit 418 as described in reference to FIG. 4A.

Although not shown in FIG. 5, in some other implementations, the visible pixel 504 and the NIR pixel 502 may alternatively be fabricated to collect holes instead of electrons. In this case, the p+ Si region 513 would be replaced by an n+ Si region, the n-Si regions 512 and 522 would be replaced by p-Si regions, the p-Si regions 514 and 524 would be replaced by n-Si regions, and the n+ Si region 515 and 525 would be replaced by p+ Si regions.

Figure 6:
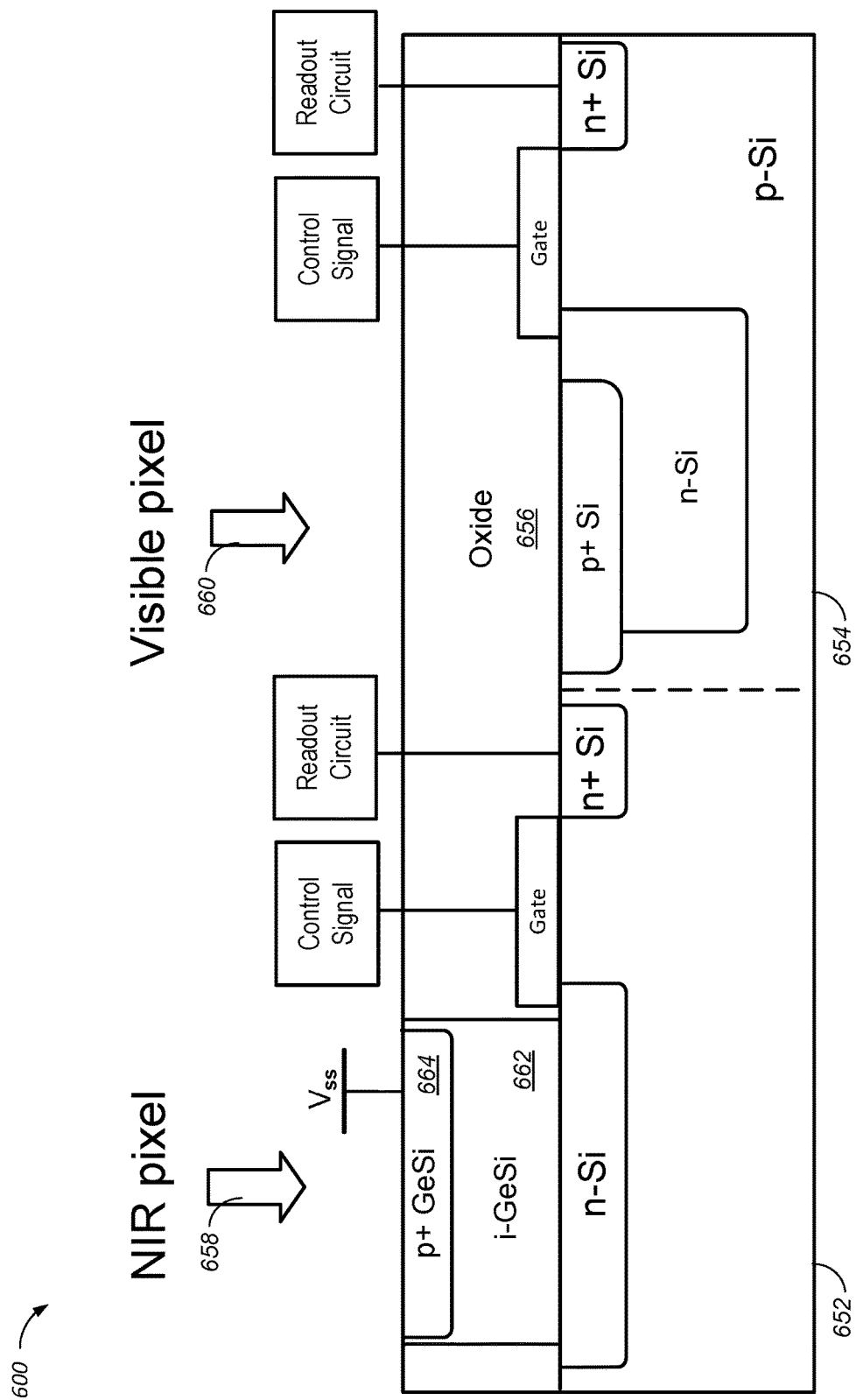
FIG. 6 is an example of a photodiode for detecting visible and infrared light.

FIG. 6 illustrates example photodiodes 600 for detecting visible and infrared optical signals. The photodiodes 600 includes a visible pixel 654 and an NIR pixel 652. The visible pixel 654 is similar to the visible pixel 504 as described in reference to FIG. 5. The NIR pixel 652 is similar to the NIR pixel 502 as described in reference to FIG. 5. Here, the surface of the visible pixel 654 and the NIR pixel 652 that receive optical signals 660 and 658 is a planarized surface, where the intrinsic GeSi region 662 and the p+ GeSi region 664 are embedded in an oxide layer 656. A planarized surface between the visible pixel 654 and the NIR pixel 652 enables additional processing on the photodiode surface and/or bonding with devices fabricated on a separate substrate.

In time-of-flight (TOF) applications, depth information of a three-dimensional object may be determined using a phase difference between a transmitted light pulse and a detected light pulse. For example, a two-dimensional array of pixels may be used to reconstruct a three-dimensional image of a three-dimensional object, where each pixel may include one or more photodiodes for deriving phase information of the three-dimensional object. In some implementations, time-of-flight applications use light sources having wavelengths in the near-infrared (NIR) range. For example, a light-emitting-diode (LED) may have a wavelength of 850 nm, 940 nm, 1050 nm, or 1310 nm. Some photodiodes may use silicon as an absorption material, but silicon is an inefficient absorption material for NIR wavelengths. Specifically, photo-carriers may be generated deeply (e.g., greater than 10 µm in depth) in the silicon substrate, and those photo-carriers may drift and/or diffuse to the photodiode junction slowly, which results in a decrease in the device bandwidth. Moreover, a small voltage swing is typically used to control photodiode operations in order to minimize power consumption. For a large absorption area (e.g., 10 µm in diameter), the small voltage swing can only create a small lateral/vertical field across the large absorption area, which affects the drift velocity of the photo-carriers being swept across the absorption area. The device bandwidth is therefore further limited. For TOF applications using NIR wavelengths, a multi-gate photodiode using germanium-silicon (GeSi) as an absorption material addresses the technical issues discussed above.

Figure 7:
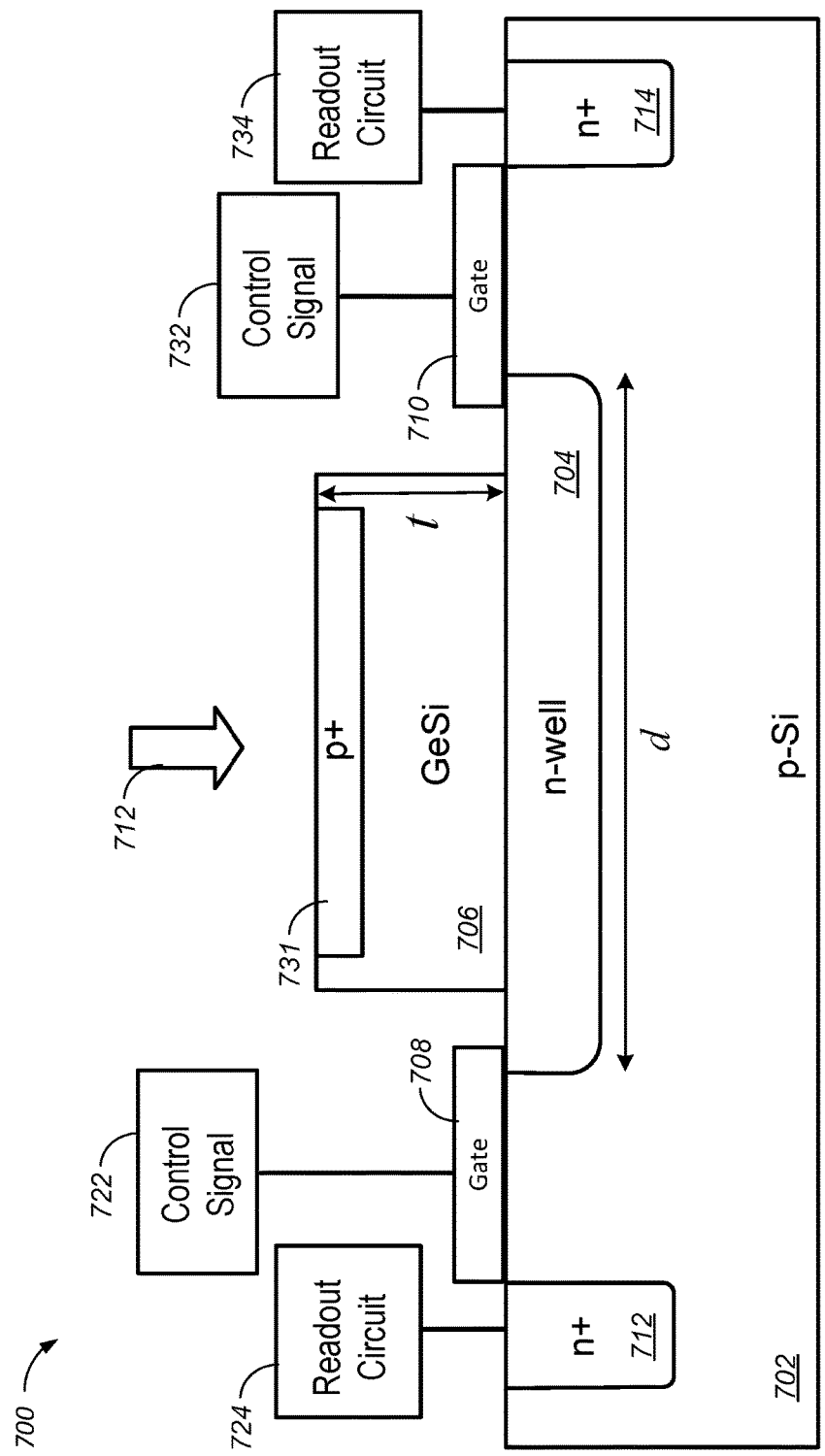
FIG. 7 is an example of a multi-gate photodiode.

FIG. 7 is an example multi-gate photodiode 700 for converting an optical signal to an electrical signal. The multi-gate photodiode 700 includes an absorption layer 706 fabricated on a substrate 702. The substrate 702 may be any suitable substrate where semiconductor devices can be fabricated on. For example, the substrate 702 may be a silicon substrate. The coupling between the absorption layer 706 and a first n+ Si region 712 is controlled by a first gate 708. The coupling between the absorption layer 706 and a second n+ Si region 714 is controlled by a second gate 710.

In general, the absorption layer 706 receives an optical signal 712 and converts the optical signal 712 into electrical signals. The absorption layer 706 is selected to have a high absorption coefficient at the desired wavelength range. For NIR wavelengths, the absorption layer 706 may be a GeSi mesa, where the GeSi absorbs photons in the optical signal 712 and generates electron-hole pairs. The material composition of germanium and silicon in the GeSi mesa may be selected for specific processes or applications. In some implementations, the absorption layer 706 is designed to have a thickness t. For example, for 850 nm wavelength, the thickness of the GeSi mesa may be approximately 1 µm to have a substantial quantum efficiency. In some implementations, the surface of the absorption layer 706 is designed to have a specific shape. For example, the GeSi mesa may be circular, square, or rectangular depending on the spatial profile of the optical signal 712 on the surface of the GeSi mesa. In some implementations, the absorption layer 706 is designed to have a lateral dimension d for receiving the optical signal 712. For example, the GeSi mesa may have a circular shape, where d can range from 1 µm to 50 µm.

In some implementations, the absorption layer 706 may include a p+ GeSi region 731. The p+ GeSi region 731 may repel the photo-electrons from the surface of the absorption region 706 and thereby may increase the device bandwidth. For example, the p+ GeSi region 731 may have a p+ doping, where the dopant concentration is as high as a fabrication process may achieve, e.g., about $5 \times 10^{20}$ cm$^{-3}$ when the absorption region 706 is germanium and doped with boron.

The multi-gate photodiode 700 includes an n-well region 704 implanted in the substrate 702. For example, the doping level of the n-well region 704 may range from $10^{15}$ cm$^{-3}$ to $10^{20}$ cm$^{-3}$. In general, the n-well region 704 is used to collect electrons generated by the absorption region 706.

The first gate 708 is coupled to a first control signal 722 and a first readout circuit 724. For example, the first gate 708 may be coupled to a voltage source, where the first control signal 722 may be a time-varying multi-level voltage signal from the voltage source. The first readout circuit 724 may be in a three-transistor configuration consisting of a reset gate, a source-follower, and a selection gate, or any suitable circuitry for processing free carriers. In some implementations, the first readout circuit 724 may be fabricated on the substrate 702. In some other implementations, the first readout circuit 724 may be fabricated on another substrate and co-packaged with the multi-gate photodiode 700 via die/wafer bonding or stacking. The second gate 710 is coupled to a second control signal 732 and a second readout circuit 734. The second control signal 732 is similar to the first control signal 722, and the second readout circuit 734 is similar to the first readout circuit 724.

The first control signal 722 and the second control signal 732 are used to control the collection of electrons generated by the absorbed photons. For example, when the first gate 708 is turned "on" and the second gate is turned "off", electrons would drift from the n-well region 704 to the n+ Si region 712. Conversely, when the first gate 708 is turned "off" and the second gate is turned "on", electrons would drift from the n-well region 704 to the n+ Si region 714. In some implementations, a voltage may be applied between the p+ GeSi region 731 and the n-well 704 to increase the electric field inside the absorption layer 706 for drifting the electrons towards the n-well region 704.

Figure 8:
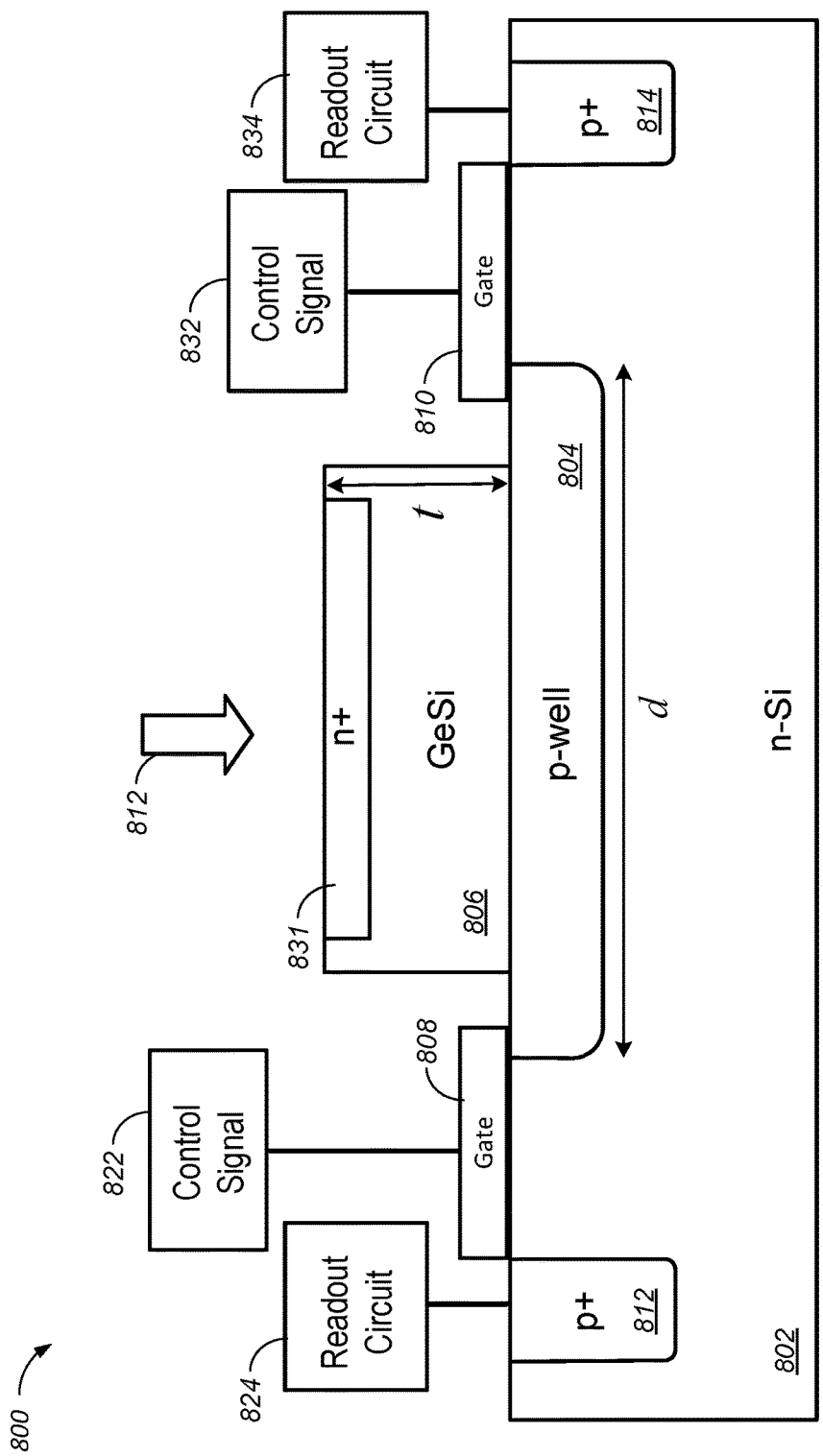
FIG. 8 is an example of a multi-gate photodiode.

FIG. 8 is an example multi-gate photodiode 800 for converting an optical signal to an electrical signal. The multi-gate photodiode 800 includes an absorption layer 806 fabricated on a substrate 802. The substrate 802 may be any suitable substrate where semiconductor devices can be fabricated on. For example, the substrate 802 may be a silicon substrate. The coupling between the absorption layer 806 and a first p+ Si region 812 is controlled by a first gate 808. The coupling between the absorption layer 806 and a second p+ Si region 814 is controlled by a second gate 810.

In general, the absorption layer 806 receives an optical signal 812 and converts the optical signal 812 into electrical signals. The absorption layer 806 is similar to the absorption layer 706 as described in reference to FIG. 7. In some implementations, the absorption layer 806 may include an n+ GeSi region 831. The n+ GeSi region 831 may repel the holes from the surface of the absorption region 806 and thereby may increase the device bandwidth. For example, the n+ GeSi region 831 may have a n+ doping, where the dopant concentration is as high as a fabrication process may achieve, e.g., about $5 \times 10^{20}$ cm$^{-3}$ when the absorption region 806 is germanium and doped with phosphorus.

The multi-gate photodiode 800 includes a p-well region 804 implanted in the substrate 802. For example, the doping level of the p-well region 804 may range from $10^{15}$ cm$^{-3}$ to $10^{20}$ cm$^{-3}$. In general, the p-well region 804 is used to collect holes generated by the absorption region 806.

The first gate 808 is coupled to a first control signal 822 and a first readout circuit 824. The first gate 808, the first control signal 822, and the first readout circuit 824 are similar to the first gate 708, the first control signal 722, and the first readout circuit 724 as described in reference to FIG. 7. The second gate 810 is coupled to a second control signal 832 and a second readout circuit 834. The second gate 810, the second control signal 832, and the second readout circuit 834 are similar to the second gate 710, the second control signal 732, and the second readout circuit 734 as described in reference to FIG. 7

The first control signal 822 and the second control signal 832 are used to control the collection of holes generated by the absorbed photons. For example, when the first gate 808 is turned "on" and the second gate 810 is turned "off", holes would drift from the p-well region 804 to the p+ Si region 812. Conversely, when the first gate 808 is turned "off" and the second gate 810 is turned "on", holes would drift from the p-well region 804 to the p+ Si region 814. In some implementations, a voltage may be applied between the n+ GeSi region 831 and the p-well 804 to increase the electric field inside the absorption layer 806 for drifting the holes towards the p-well region 804.

Figure 9:
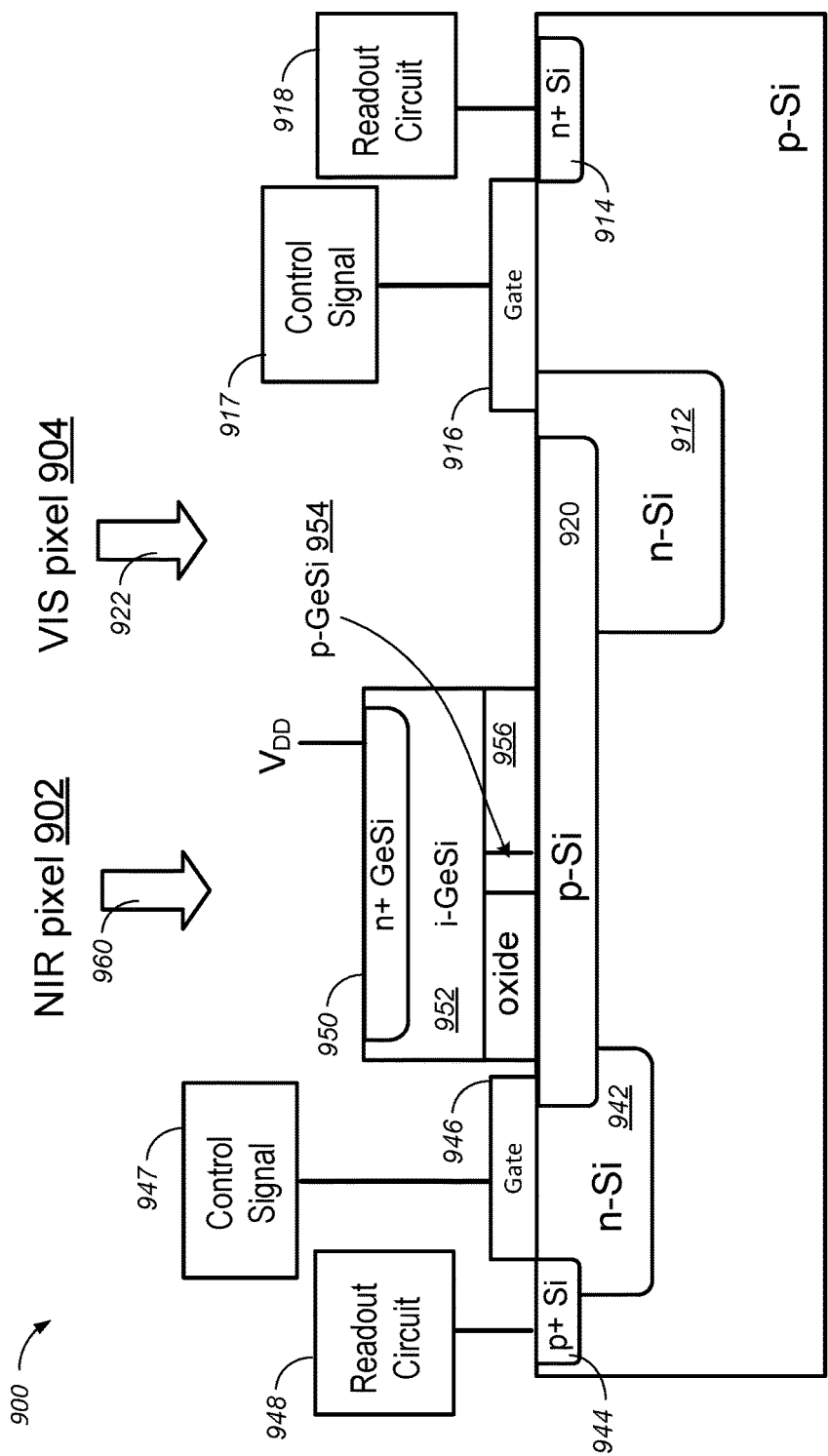
FIG. 9 is an example of a photodiode for detecting visible or infrared light.

FIG. 9 illustrates example photodiodes 900 for detecting visible and infrared optical signals. The example photodiodes 900 includes an NIR pixel 902 for collecting holes and a visible pixel 904 for collecting electrons, where the NIR pixel 902 and the visible pixel 904 are formed on a common substrate. The NIR pixel 902 and the visible pixel 904 are not separated by an isolation structure. The NIR pixel 902 is configured to detect an optical signal having a wavelength in the NIR range. The visible pixel 904 is configured to detect an optical signal having a wavelength in the visible range (e.g., blue and/or green and/or red). The NIR pixel 902 and the visible pixel 904 may be photodiodes in the sensor layer 108 as described in reference to FIG. 1, for example.

The visible pixel 904 is configured to collect free electrons generated from photo-generated carriers, and includes an n-Si region 912, an n+ Si region 914, an p-Si region 920, a first gate 916, a first control signal 917 coupled to the first gate 916, and a first readout circuit 918 coupled to the n+ Si region 914. The n-Si region 912 may be lightly doped with an n-dopant, e.g., about $10^{16}$ cm$^{-3}$ with phosphorus. The n+ Si region 914 may have an n+ doping, where the activated dopant concentration is as high as a fabrication process may achieve, e.g., about $5 \times 10^{20}$ cm$^{-3}$ with phosphorous. The p-Si region 920 may be lightly doped with a p-dopant, e.g., about $10^{16}$ cm$^{-3}$ with boron.

In general, the p-Si layer 920 receives an optical signal 922. Since the thickness of the p-Si layer 920 is generally thin (e.g., 50-100 nm), the optical signal 922 propagates into the n-Si region 912, where the n-Si region 912 absorbs the optical signal 922 and converts the optical signal 922 into free carriers. In some implementations, the optical signal 922 may be filtered by a wavelength filter not shown in this figure, such as a filter in the filter layer 110 as described in reference to FIG. 1. In some implementations, a beam profile of the optical signal 922 may be shaped by a lens not shown in this figure, such as a lens in the lens layer 112 as described in reference to FIG. 1.

In general, a difference between the Fermi level of the p-Si region 920 and the Fermi level of the n-Si region 912 creates an electric field between the two regions, where free electrons generated by the n-Si region 912 are drifted towards the region below the p-Si region 920 by the electric field. The first gate 916 may be coupled to the first control signal 917. For example, the first gate 916 may be coupled to a voltage source, where the first control signal 917 may be a DC voltage signal from the voltage source. The first control signal 917 controls a flow of free electrons from the region below the p-Si region 920 to the n+ Si region 914. For example, if a voltage of the control signal 917 exceeds a threshold voltage, free electrons accumulated in the region below the p-Si region 920 will drift to the n+ Si region 914 for collection. The n+ Si region 914 may be coupled to the first readout circuit 918 that processes the collected electrical signal. The first readout circuit 918 may be similar to the first readout circuit 418 as described in reference to FIG. 4A.

The NIR pixel 902 is configured to collect free holes generated from photo-generated carriers, and includes an n-Si region 942, a p+ Si region 944, a second gate 946, a second control signal 947 coupled to the second gate 946, a second readout circuit 948 coupled to the p+ Si region 944, a n+ GeSi region 950, an intrinsic GeSi region 952, a p-Ge region 954, and an oxide region 956. In addition, the NIR pixel 902 shares the p-Si region 920 with the VIS pixel 904.

The n-Si region 942 may be lightly doped with an n-dopant, e.g., about $10^{15}$ cm$^{-3}$ with phosphorus. The p+ Si region 944 may have an p+ doping, where the activated dopant concentration is as high as a fabrication process may achieve, e.g., about $5 \times 10^{20}$ cm$^{-3}$ with boron. The n+ GeSi region 950 receives an optical signal 960 and converts the optical signal 960 into electrical signals. Since the thickness of the n+ GeSi layer 950 is generally thin (e.g., 50-100 nm), the optical signal 960 propagates into the intrinsic GeSi region 952, where the intrinsic GeSi region 952 absorbs the optical signal 960 and converts the optical signal 960 into free carriers. In some implementations, the optical signal 960 may be filtered by a wavelength filter not shown in this figure, such as an NIR filter in the filter layer 110 as described in reference to FIG. 1. In some implementations, a beam profile of the optical signal 960 may be shaped by a lens not shown in this figure, such as a lens in the lens layer 112 as described in reference to FIG. 1.

In some implementations, a thickness of the intrinsic GeSi region 952 may be between 0.05 pm to 2 pm. In some implementations, the n+ GeSi region 950 may repel the holes generated away from the intrinsic GeSi region 952 to avoid surface recombination and thereby may increase the carrier collection efficiency. For example, the n+ GeSi region 950 may have a n+ doping, where the dopant concentration is as high as a fabrication process may achieve, e.g., about $5 \times 10^{20}$ cm$^{-3}$ when the intrinsic GeSi region 950 is germanium and doped with phosphorus.

The photo-generated free holes in the intrinsic GeSi region 952 may drift or diffuse into the p-Si region 920. The photo-generated free electrons in the intrinsic GeSi region 952 may be repelled by the p-GeSi region 954, which prevents the free electrons from entering the p-Si region 920. In some implementations, a drain supply voltage VDD may be applied to the NIR pixel 902 to create an electric field between the n+ GeSi region 950 and the p-Si region 920, such that the free holes may drift towards the p-Si region 920 while the free electrons may drift towards the n+ GeSi region 950.

The second gate 946 may be coupled to the second control signal 947. For example, the second gate 946 may be coupled to a voltage source, where the second control signal 947 may be a DC voltage signal from the voltage source. The second control signal 947 controls a flow of free holes from the p-Si region 920 to the p+ Si region 944. For example, if a voltage of the second control signal 947 exceeds a threshold voltage, free holes accumulated in the p-Si region 920 will drift towards the p+ Si region 944. The p+ Si region 944 may be coupled to the second readout circuit 948 for further processing of the collected electrical signal.

Although not shown in FIG. 9, in some other implementations, the visible pixel 904 may alternatively be fabricated to collect holes instead of electrons and the NIR pixel 902 may alternatively be fabricated to collect electrons instead of holes. In this case, the p-Si region 920 would be replaced by an n-Si region, the n-Si regions 942 and 912 would be replaced by p-Si regions, the p+ Si region 944 would be replaced by an n+ Si region, the n+ Si region 914 would be replaced by a p+ Si region, the n+ GeSi region 950 would be replaced by a p+ GeSi region, and the p-GeSi region 954 would be replaced by an n-GeSi region.

In some implementations, the direction of light signal shown in FIGS. 4A, 4B, 5, 6, 7, 8, and 9 may be reversed depending on designs, packaging, and applications. For example, referring to FIG. 4A, the optical signal 406 may enter the NIR pixel 402 through the p+ Si region 423, propagate through the n-Si region 422, and then be absorbed by the intrinsic GeSi region 433.

Figure 10:
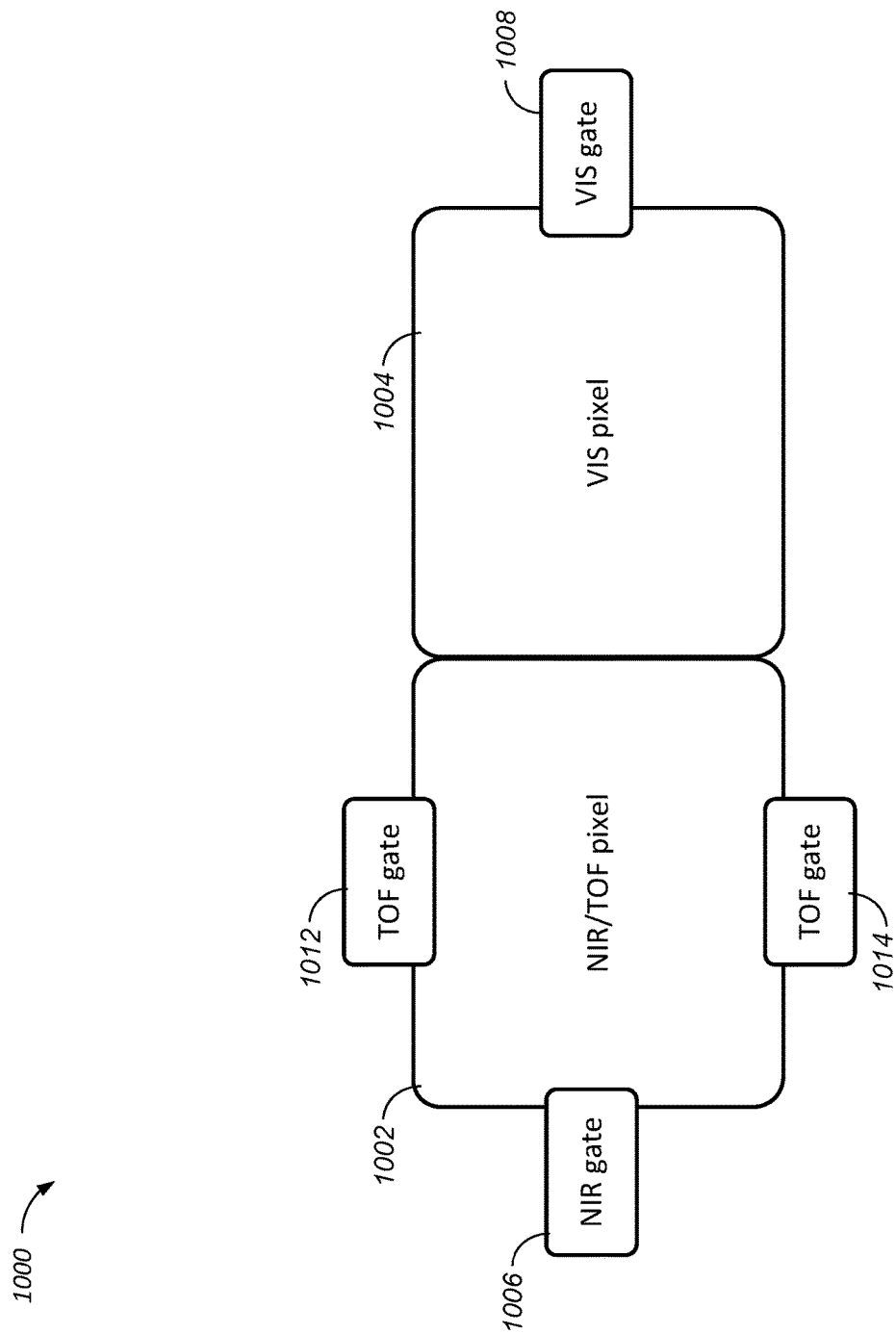
FIG. 10 is an example of an integrated photodiode array for detecting visible and/or infrared light.

FIG. 10 shows a top view of an example integrated photodiode array 1000 for detecting visible and NIR light as well as for a TOF application. The photodiode array 1000 includes a NIR/TOF pixel 1002 and a VIS pixel 1004. The NIR/TOF pixel 1002 includes an NIR gate 1006, a first TOF gate 1012, and a second TOF gate 1014. The VIS pixel 1004 includes a VIS gate 1008. The NIR/TOF pixel 1002 and the VIS pixel 1004 are not isolated by an isolation structure. The controls of the charge readout using the NIR gate 1006 and the VIS gate 1008 are similar to the multi-gate photodiode 900 as described in reference to FIG. 9. The controls of the charge readout using the TOF gates 1012 and 1014 are similar to the multi-gate photodiode 700 as described in reference to FIG. 7 or the multi-gate photodiode 800 as described in reference to FIG. 8. The readout circuits coupled to the NIR gate 1006 and the TOF gates 1012 and 1014 would collect the same type of carriers, and the readout circuit coupled to the VIS gate 1008 would collect the opposite type of carriers. For example, if the readout circuits of the NIR gate 1006 and the TOF gates 1012 and 1014 are configured to collect electrons, the readout circuit coupled to the VIS gate 1008 would be configured to collect holes. Conversely, if the readout circuits of the NIR gate 1006 and the TOF gates 1012 and 1014 are configured to collect holes, the readout circuit coupled to the VIS gate 1008 would be configured to collect electrons.

Figure 11:
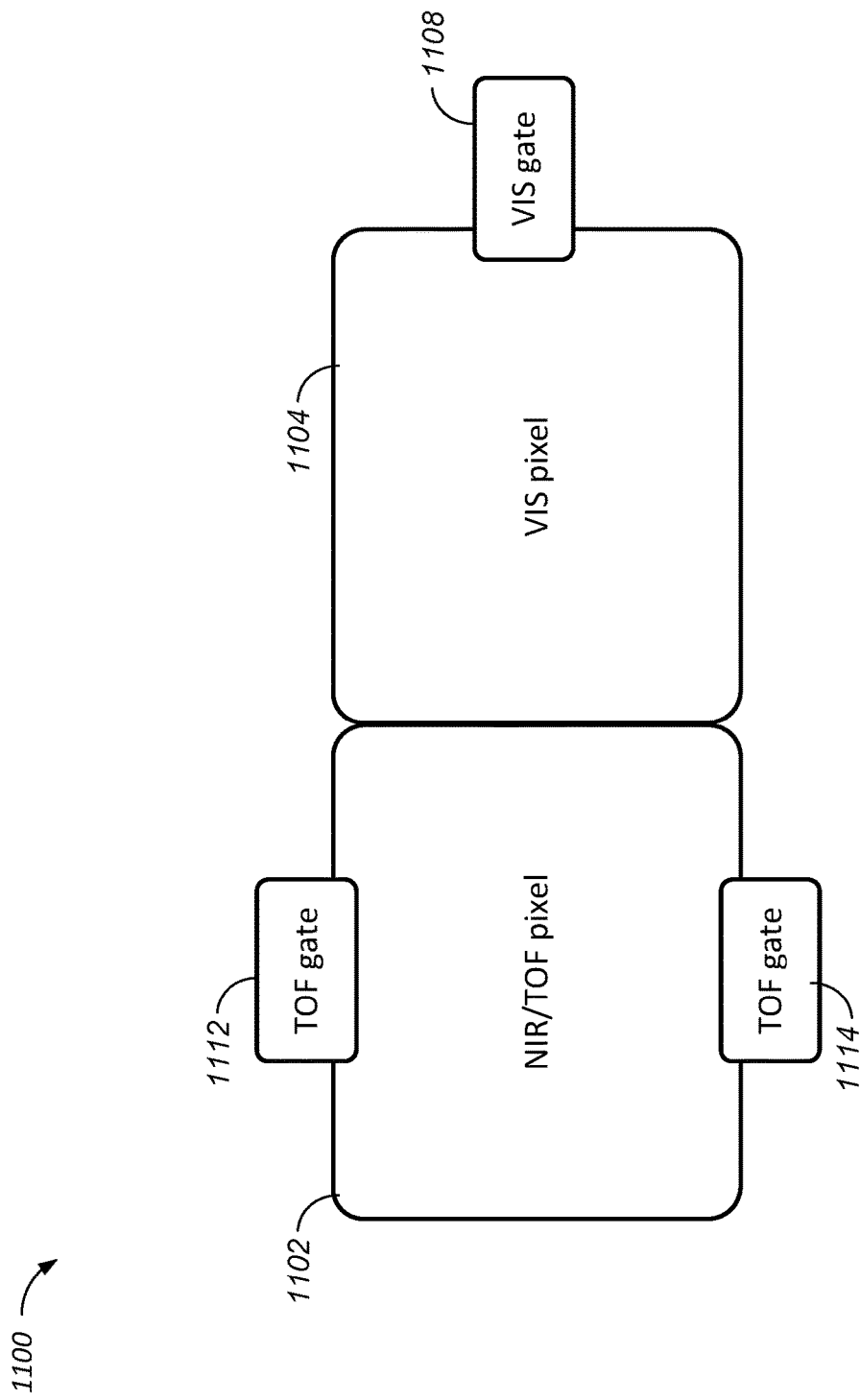
FIG. 11 is an example of an integrated photodiode array for detecting visible and/or infrared light.

FIG. 11 shows a top view of an example integrated photodiode array 1100 for detecting visible light and for a TOF application. The photodiode array 1100 includes a NIR/TOF pixel 1102 and a VIS pixel 1104. The NIR/TOF pixel 1102 includes a first TOF gate 1112, and a second TOF gate 1114. The VIS pixel 1104 includes a VIS gate 1108. The NIR/TOF pixel 1102 and the VIS pixel 1104 are not isolated by an isolation structure. The controls of the charge readout using the VIS gate 1108 are similar to the multi-gate photodiode 900 as described in reference to FIG. 9. The controls of the charge readout using the TOF gates 1112 and 1114 are similar to the multi-gate photodiode 700 as described in reference to FIG. 7 or the multi-gate photodiode 800 as described in reference to FIG. 8. The readout circuits coupled to the TOF gates 1112 and 1114 would collect the same type of carriers, and the readout circuit coupled to the VIS gate 1108 would collect the opposite type of carriers. For example, if the readout circuits of the TOF gates 1112 and 1114 are configured to collect electrons, the readout circuit coupled to the VIS gate 1108 would be configured to collect holes. Conversely, if the readout circuits of the TOF gates 1112 and 1114 are configured to collect holes, the readout circuit coupled to the VIS gate 1108 would be configured to collect electrons.

Figure 12:
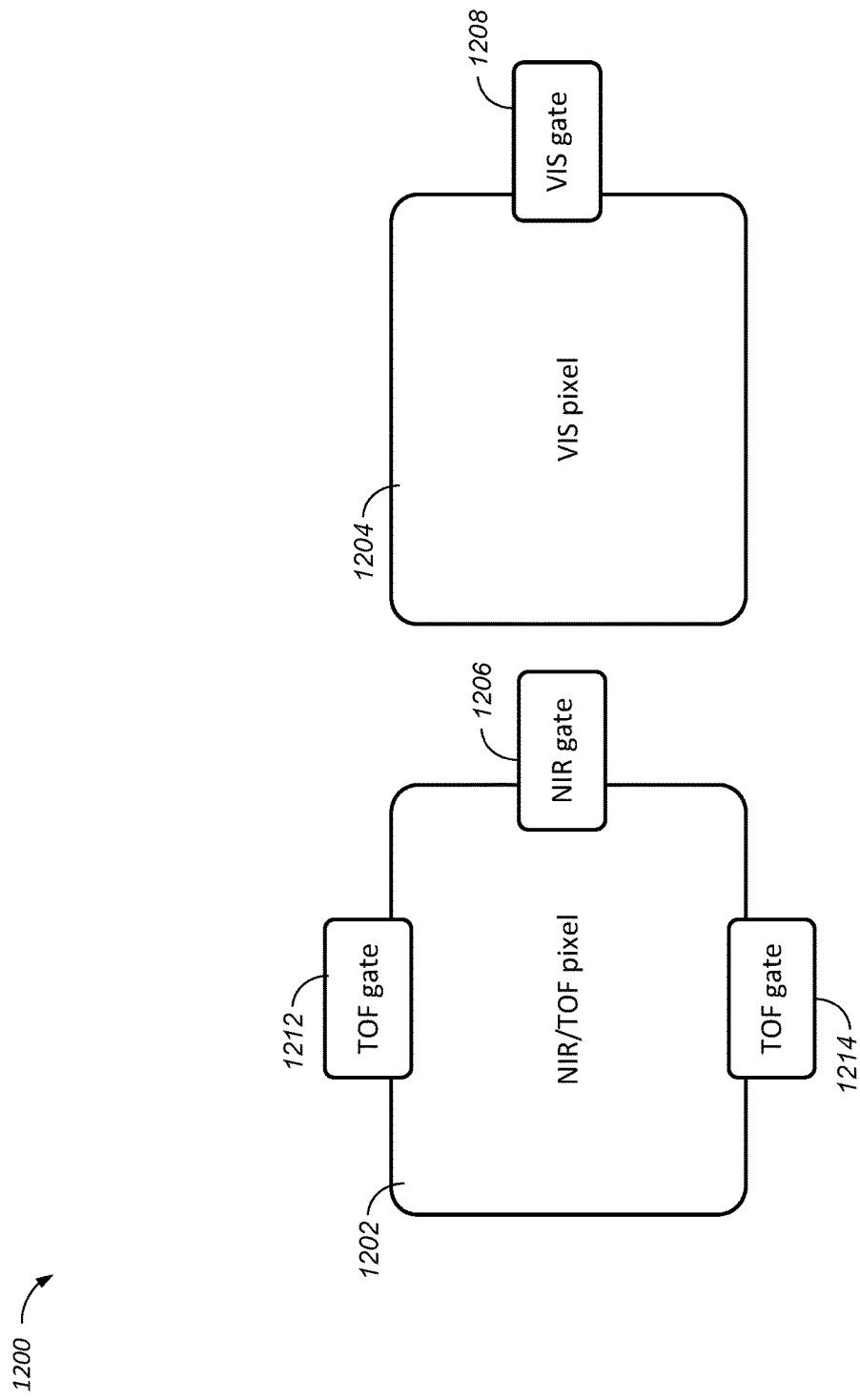
FIG. 12 is an example of an integrated photodiode array for detecting visible and/or infrared light.

FIG. 12 shows a top view of an example integrated photodiode array 1200 for detecting visible and NIR light as well as for a TOF application. The photodiode array 1200 includes a NIR/TOF pixel 1202 and a VIS pixel 1204. The NIR/TOF pixel 1202 includes an NIR gate 1206, a first TOF gate 1212, and a second TOF gate 1214. The VIS pixel 1204 includes a VIS gate 1208. The NIR/TOF pixel 1202 and the VIS pixel 1204 are isolated by an isolation structure. The controls of the charge readout using the NIR gate 1206 and the VIS gate 1208 are similar to the photodiodes 400 as described in reference to FIG. 4A, or the photodiodes 450 as described in reference to FIG. 4B, or the photodiodes 500 as described in reference to FIG. 5, or the photodiodes 600 as described in reference to FIG. 6. The controls of the charge readout using the TOF gates 1206 and 1208 are similar to the multi-gate photodiode 700 as described in reference to FIG. 7 or the multi-gate photodiode 800 as described in reference to FIG. 8. The readout circuits coupled to the NIR gate 1206 and the TOF gates 1212 and 1214 would collect the same type of carriers, and the readout circuit coupled to the VIS gate 1208 may or may not collect the same type of carriers. For example, if the readout circuits of the NIR gate 1206 and the TOF gates 1212 and 1214 are configured to collect electrons, the readout circuit coupled to the VIS gate 1208 may be configured to collect holes or electrons depending on the design because the NIR/TOF pixel 1202 and the VIS pixel 1204 are isolated. Similarly, if the readout circuits of the NIR gate 1206 and the TOF gates 1212 and 1214 are configured to collect holes, the readout circuit coupled to the VIS gate 1208 may be configured to collect holes or electrons.

Figure 13:
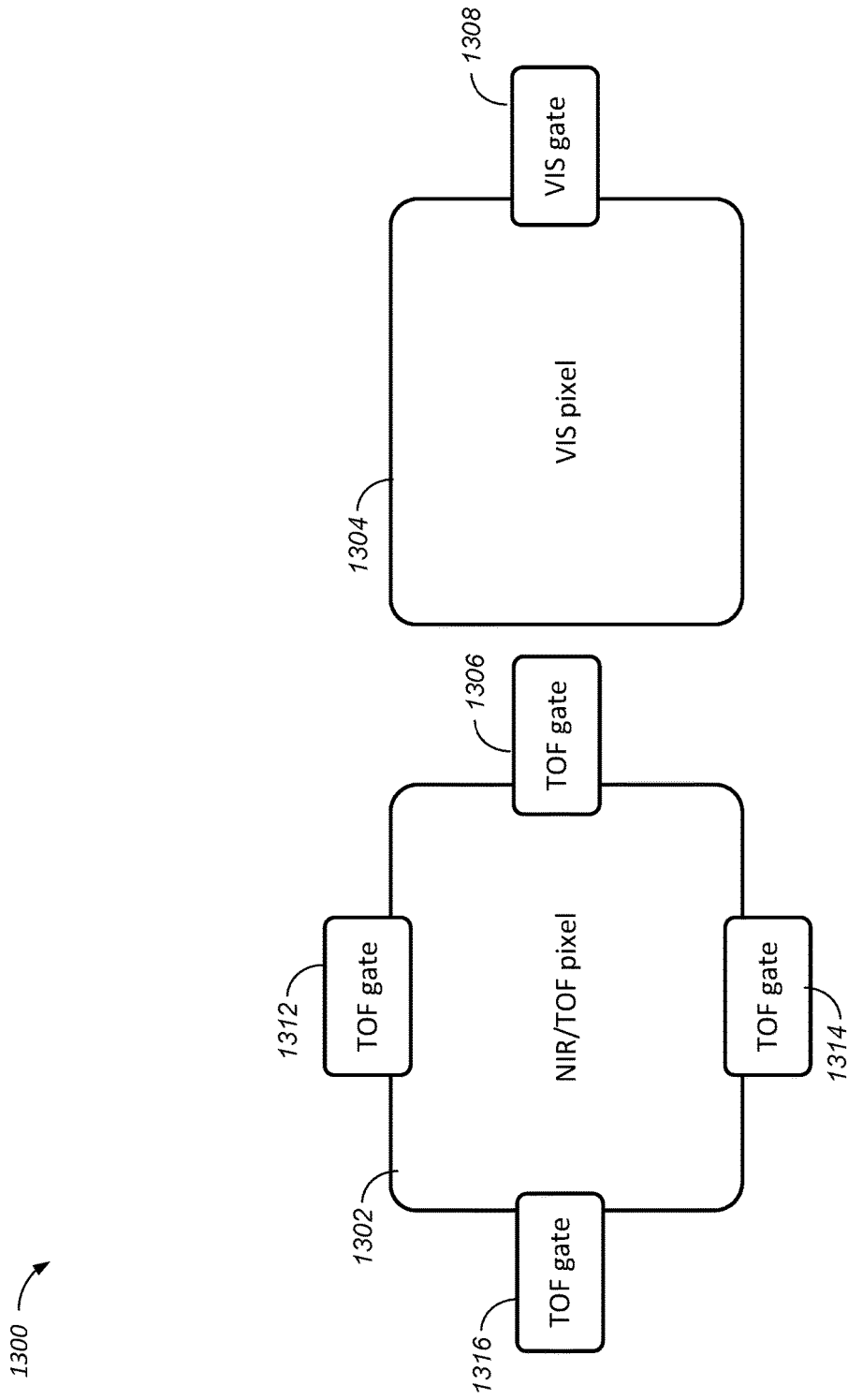
FIG. 13 is an example of an integrated photodiode array for detecting visible and/or infrared light.

FIG. 13 shows a top view of an example integrated photodiode array 1300 for detecting visible light as well as for a TOF application. The photodiode array 1300 includes a NIR/TOF pixel 1302 and a VIS pixel 1304. The NIR/TOF pixel 1302 includes a first TOF gate 1306, a second TOF gate 1312, a third TOF gate 1314, and a fourth TOF gate 1316. The four TOF gates may be used to extract additional phase information about the collected signal. The VIS pixel 1304 includes a VIS gate 1308. The NIR/TOF pixel 1302 and the VIS pixel 1304 are isolated by an isolation structure. The controls of the charge readout using the VIS gate 1308 are similar to the photodiodes 400 as described in reference to FIG. 4A, or the photodiodes 450 as described in reference to FIG. 4B, or the photodiodes 500 as described in reference to FIG. 5, or the photodiodes 600 as described in reference to FIG. 6. The controls of the charge readout using the TOF gates 1306, 1312, 1314, and 1316 are similar to the multi-gate photodiode 700 as described in reference to FIG. 7 or the multi-gate photodiode 800 as described in reference to FIG. 8. The readout circuits coupled to the TOF gates 1306, 1312, 1314, and 1316 would collect the same type of carriers, and the readout circuit coupled to the VIS gate 1308 may or may not collect the same type of carriers. For example, if the readout circuits of the TOF gates 1306, 1312, 1314, and 1316 are configured to collect electrons, the readout circuit coupled to the VIS gate 1308 may be configured to collect holes or electrons depending on the design because the NIR/TOF pixel 1302 and the VIS pixel 1304 are isolated. Similarly, if the readout circuits of the TOF gates 1306, 1312, 1314, and 1316 are configured to collect holes, the readout circuit coupled to the VIS gate 1308 may be configured to collect holes or electrons.

Figure 14B:
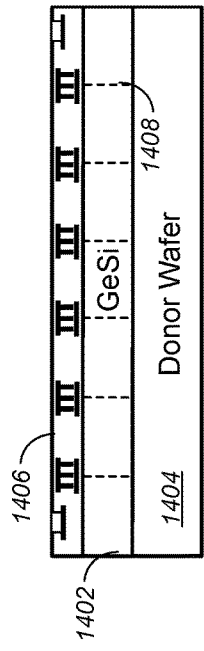
FIGS. 14A-14D illustrate an example of a design for fabricating a photodiode array.
Figure 14D:
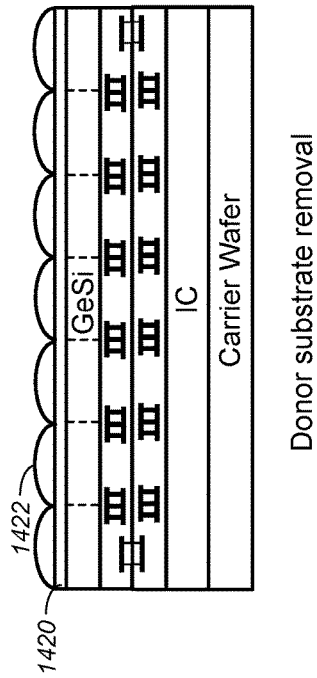
Figure 14A:
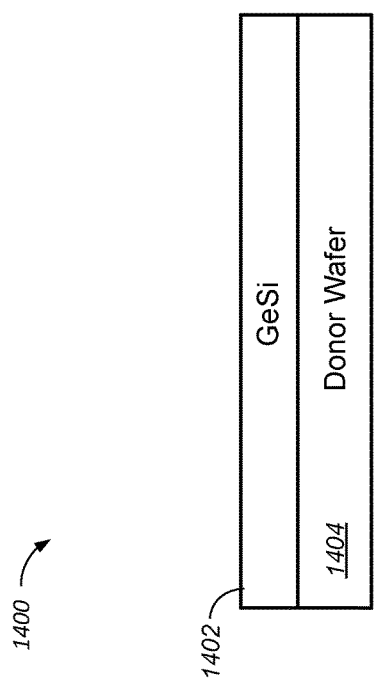

FIGS. 14A-14D illustrate an example design 1400 for fabricating a photodiode array. Referring to FIG. 14A, a germanium-silicon layer 1402 was formed on a donor wafer 1404. The donor wafer 1404 may be a silicon wafer. The germanium-silicon layer 1402 may be formed using epitaxial growth through chemical vapor deposition (CVD) system.

Referring to FIG. 14B, the isolation structures 1408 are formed in the germanium-silicon layer 1402 to define the photodiode regions. The isolation structures 1408 may be formed through dry-etch of the isolation structure patterns followed by a deposition of insulating materials such as oxide, or by implantations to form a doping junction, or any other suitable techniques. Although not shown in the figure, there may be one or more processing steps that further process the photodiodes. For example, there may be a doping step to define a p+ GeSi region on the surface of an intrinsic GeSi region. An interconnect layer 1406 is then formed on the germanium-silicon layer 1402, where multiple interconnects are formed in a dielectric layer to establish electrical connections with the germanium-silicon layer 1402, and where alignment marks for bonding alignment are formed.

Figure 14C:
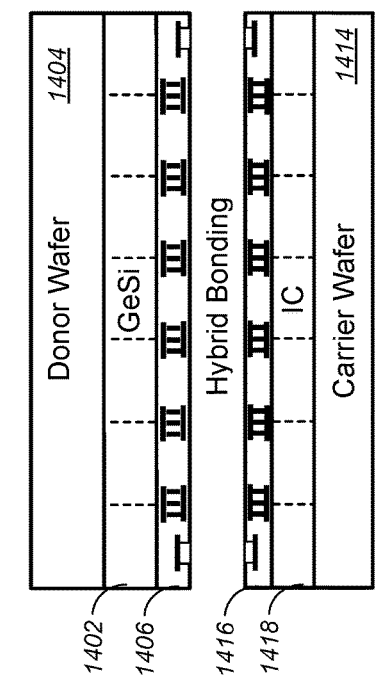

Referring to FIG. 14C, an interconnect layer 1416 of a carrier substrate 1414 is bonded with the interconnect layer 1406 of the donor wafer 1404. Note that the interconnect layer referred herein may include conductive electrical path (e.g., metallic layer) and dielectric layer to isolate individual conductive electrical path. The carrier substrate 1414 may be a silicon substrate, where one or more layers 1418 of circuitry may be formed on the silicon substrate. The circuitry may be control circuitry, readout circuitry, and/or any other suitable circuitry for the photodiode array. Alignment marks may be formed in both the layers 1406 and 1416 by any suitable techniques. The bonding between the layers 1406 and 1416 may be done by any suitable techniques such as thermal bonding or hybrid bonding including metal-metal bonding and oxide-oxide bonding.

Referred to FIG. 14D, a filter layer 1420 and a lens layer 1422 are formed on the germanium-silicon layer 1402 to form the photodiode array. Although not shown, the donor wafer 1404 may be removed by polishing or other suitable techniques after bonding and before forming the filter layer 1420. In some other implementations, although not shown in these figures, germanium may replace germanium-silicon as the sensor material in the descriptions related to FIGS. 14A-14D.

Figures 15A, 15B, 15C, 15D:
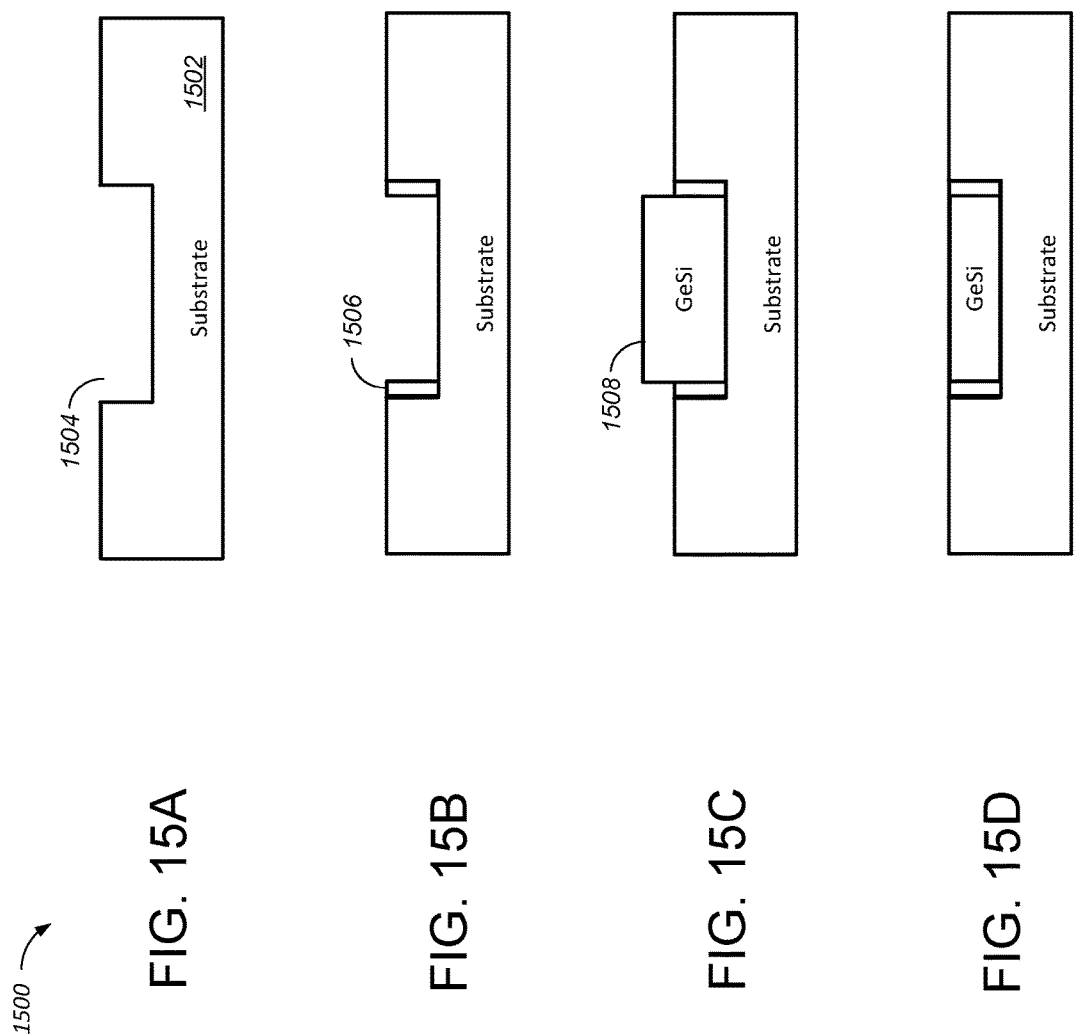
FIGS. 15A-15D illustrate an example of a design for forming germanium-silicon.

FIGS. 15A-15D illustrate an example design 1500 for selectively forming germanium-silicon on a substrate. The design 1500 may be used to fabricate the photodiode array 100, 200, or 300, for example. Referring to FIG. 15A, a recess 1504 is formed on a substrate 1502. The recess 1504 may define the photodiode area for an NIR pixel. The recess may be formed using lithography followed by a dry etching of the substrate 1502. The shape of the recess may correspond to the shape of the pixel, such as a square, a circle, or other suitable shapes.

Referring to FIG. 15B, a dielectric layer may be deposited over the substrate, and a directional etch may be performed to form a sidewall spacer 1506. The directional etch may be an anisotropic dry etch. Referring to FIG. 15C, a germanium or germanium-silicon region 1508 is selectively grown from the substrate 1502. For example, the germanium-silicon region 1508 may be formed using epitaxial growth through chemical vapor deposition (CVD) system.

Referring to FIG. 15D, the germanium or germanium-silicon region 1508 is planarized with the substrate 1502. The germanium or germanium-silicon region 1508 may be planarized using chemical mechanical polishing (CMP) or any other suitable techniques. In some other implementations, although not shown in these figures, germanium may replace germanium-silicon as the sensor material in the descriptions related to FIGS. 15A-15D.

Figure 16A:
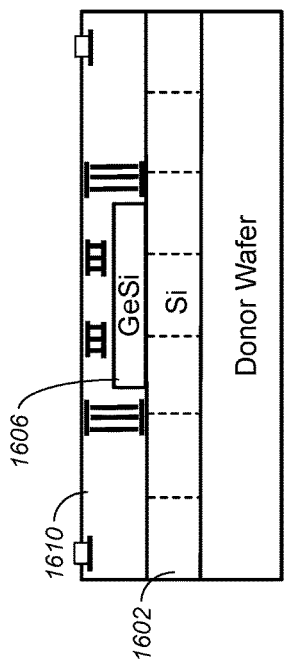
FIGS. 16A-16D illustrate an example of a design with exemplary fabrication of a photodiode array.

FIGS. 16A-16D illustrate an example design 1600 for fabricating a photodiode array. The design 1600 may be used to fabricate the photodiodes 400, 450, 500, 600, 700, 800 and 900 as described respectively in reference to FIG. 4A, 4B, 5, 6, 7, 8 and 9, for example. Referring to FIG. 16A, silicon photodiodes 1602 are formed on a donor wafer 1604, and a germanium-silicon photodiode 1606 was selectively grown on the donor wafer 1604. The visible pixel 454 may be an example of a diode of the silicon photodiodes 1602, and the NIR pixel 452 may be an example of a diode of the GeSi photodiodes 1606. The selective growth of germanium-silicon photodiode may be done using the design 1500 as described in reference to FIG. 15A-15D or any other suitable designs or processes.

Figure 16B:
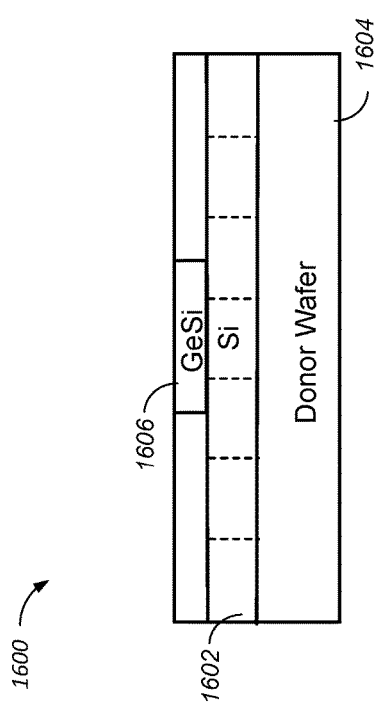

Referring to FIG. 16B, an interconnect layer 1610 is formed on the germanium-silicon photodiode 1606, where multiple interconnects are formed in a dielectric layer to establish electrical connections with the germanium-silicon photodiode 1606 and the silicon photodiodes 1602, and where alignment marks for bonding alignment are formed.

Figure 16C:
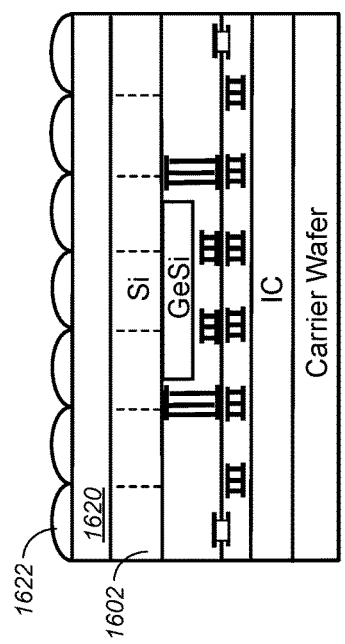

Referring to FIG. 16C, an interconnect layer 1616 of a carrier substrate 1614 is bonded with the interconnect layer 1610 of the donor wafer 1604. The carrier substrate 1614 may be a silicon substrate, where one or more layers 1618 of circuitry may be formed on the silicon substrate. The circuitry may be control circuitry, readout circuitry, and/or any other suitable circuitry for the photodiode array. Alignment marks may be formed in both the layers 1610 and 1616 by any suitable techniques. The bonding between the layers 1610 and 1616 may be done by any suitable techniques such as thermal bonding or hybrid bonding including metal-metal bonding and oxide-oxide bonding.

Figure 16D:
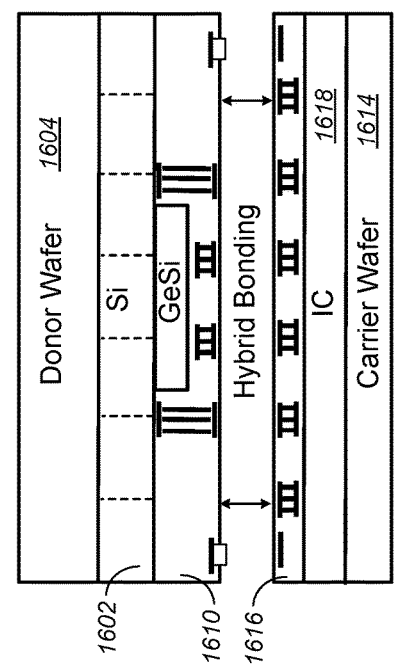

Referred to FIG. 16D, a filter layer 1620 and a lens layer 1622 are formed on the silicon photodiode 1602 to form the photodiode array. Although not shown, the donor wafer 1604 may be removed by polishing or other suitable techniques after bonding and before forming the filter layer 1620. In some other implementations, although not shown in these figures, germanium may replace germanium-silicon as the sensor material in the descriptions related to FIGS. 16A-16D.

Figure 17A:
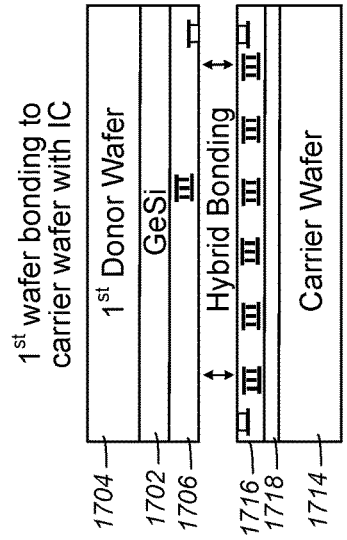
FIGS. 17A-17F illustrate an example of a design with exemplary fabrication of a photodiode array.

FIGS. 17A-17E illustrate an example design 1700 for fabricating a photodiode array. The design 1700 may be used to fabricate the photodiodes 400, 450, 500, 600, 700, 800 and 900 as respectively described in reference to FIG. 4A, 4B, 5, 6, 7, 8 and 9, for example. Referring to FIG. 17A, a germanium-silicon layer 1702 was formed on a first donor wafer 1704. A first interconnect layer 1706 is formed on the germanium-silicon layer 1702 with multiple interconnects and alignment marks.

Figure 17B:
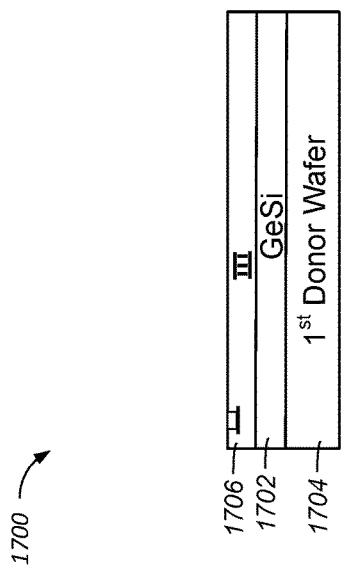

Referring to FIG. 17B, an interconnect layer 1716 of a carrier substrate 1714 is bonded with the interconnect layer 1706 of the first donor wafer 1704. The carrier substrate 1714 may be a silicon substrate, where one or more layers 1718 of circuitry may be formed on the silicon substrate. The circuitry may be control circuitry, readout circuitry, and/or any other suitable circuitry for the photodiode array. The bonding between the layers 1706 and 1716 may be done by any suitable techniques such as thermal bonding or hybrid bonding including metal-metal bonding and oxide-oxide bonding.

Figure 17C:
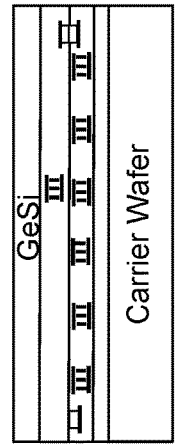

Referring to FIG. 17C, the first donor wafer 1704 is removed by polishing or other suitable techniques after bonding. Referring to FIG. 17D, a first germanium-silicon photodiode 1720 is formed. The first germanium-silicon photodiode 1720 may be formed using a pattern and an etch of the germanium-silicon layer 1702, followed by a deposition of a passivation layer such as a dielectric layer. The dielectric layer may be planarized through CMP or other suitable techniques. A via 1722 may be formed by an anisotropic etch followed by a deposition of conductive materials such as copper.

Figure 17E:
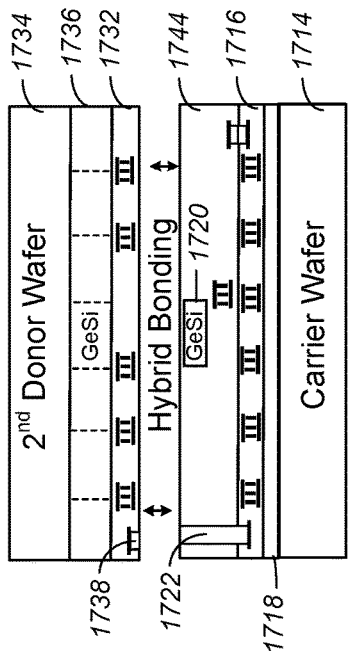

Referring to FIG. 17E, the dielectric layer 1744 of the carrier substrate 1714 is bonded with an interconnect layer 1732 of a second donor wafer 1734. A germanium-silicon photodiode array 1736 are formed on the second donor wafer 1734. The via 1738 is bonded with the via 1722 to establish electrical connections between the first germanium-silicon photodiode 1720, the germanium-silicon photodiode array 1736, and the integrated circuits 1718.

Figure 17F:
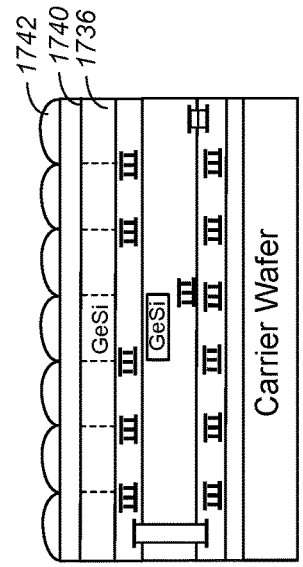
Figure 17D:
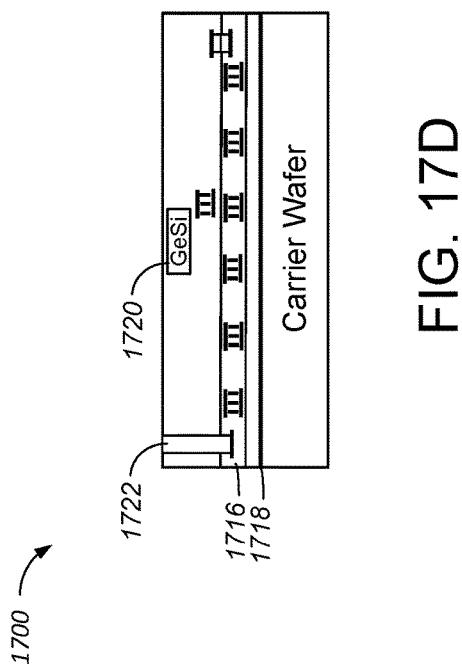

Referred to FIG. 17F, a filter layer 1740 and a lens layer 1742 are formed on the germanium-silicon photodiode array 1736 to form the photodiode array. Although not shown, the second donor wafer 1734 may be removed by polishing or other suitable techniques after bonding and before forming the filter layer 1740. In some other implementations, although not shown in these figures, germanium may replace germanium-silicon as the sensor material in the descriptions related to FIGS. 17A-17F.

Figure 18A:
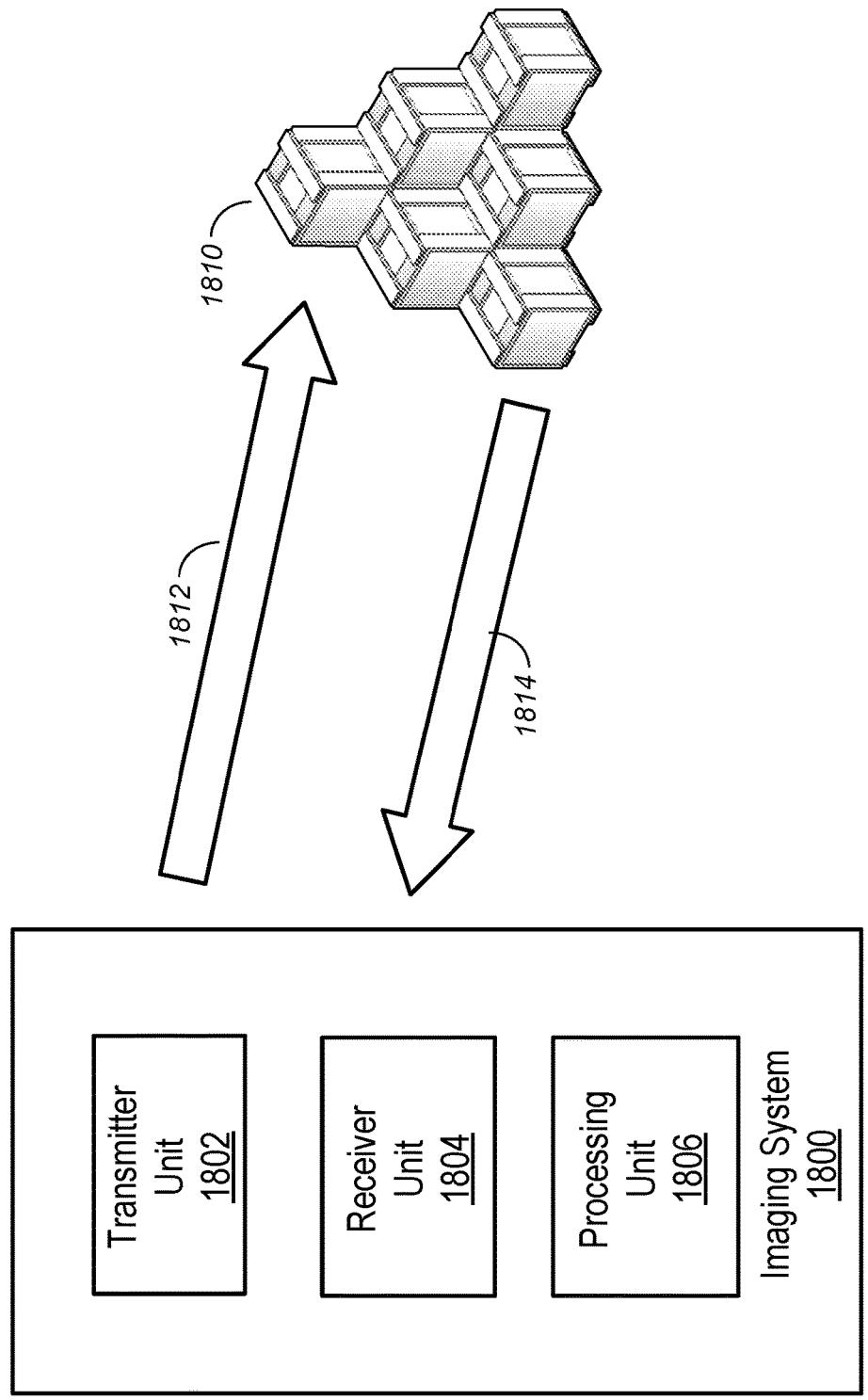
FIG. 18A is a block diagram of an example of an imaging system.

FIG. 18A shows an example imaging system 1800 for determining characteristics of a target object 1810. The target object 1810 may be a three-dimensional object. The imaging system 1800 may include a transmitter unit 1802, a receiver unit 1804, and a processing unit 1806. In general, the transmitter unit 1802 emits light 1812 towards the target object 1810. The transmitter unit 1802 may include one or more light sources, control circuitry, and/or optical elements. For example, the transmitter unit 1802 may include one or more NIR or visible LEDs, where the emitted light 1812 may be collimated by a collimating lens to propagate in free space.

In general, the receiver unit 1804 receives the reflected light 1814 that is reflected from the target object 1810. The receiver unit 1804 may include one or more photodiodes, control circuitry, and/or optical elements. For example, the receiver unit 1804 may include an image sensor, where the image sensor includes multiple pixels fabricated on a semiconductor substrate. Each pixel may include one or more multi-gate photodiodes for detecting the reflected light 1814, where the reflected light 1814 may be focused to the photodiodes. Each photodiode may be the multi-gate photodiode disclosed in this patent application.

In general, the processing unit 1806 processes the photocarriers generated by the receiver unit 1804 and determines characteristics of the target object 1810. The processing unit 1806 may include control circuitry, one or more processors, and/or computer storage medium that may store instructions for determining the characteristics of the target object 1810. For example, the processing unit 1806 may include readout circuits and processors that can process information associated with the collected photo-carriers to determine the characteristics of the target object 1810. In some implementations, the characteristics of the target object 1810 may be depth information of the target object 1810. In some implementations, the characteristics of the target object 1810 may be material compositions of the target object 1810.

Figure 18B:
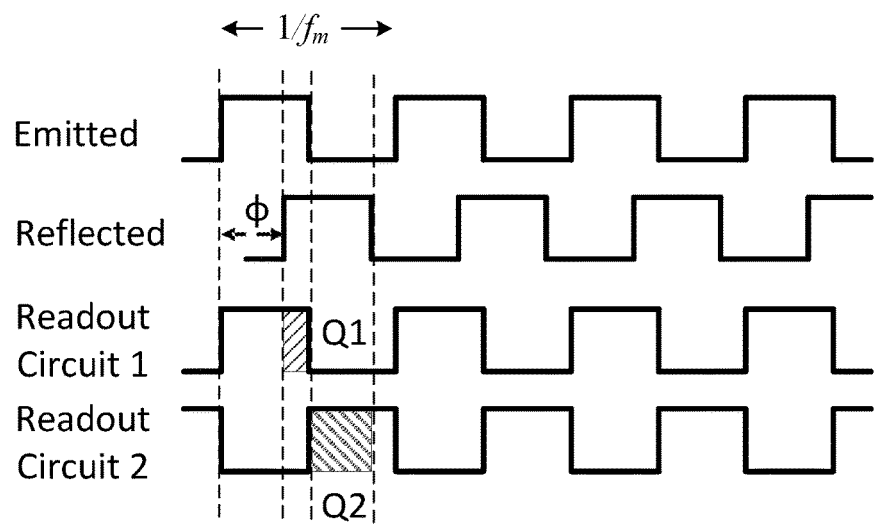
FIGS. 18B and 18C show examples of techniques for determining characteristics of an object using an imaging system.

FIG. 18B shows one example technique for determining characteristics of the target object 1810. The transmitter unit 1802 may emit light pulses 1812 modulated at a frequency $f_m$ with a duty cycle of 50% as an example. The receiver unit 1804 may receive reflected light pulses 1814 having a phase shift of Φ. The multi-gate photodiodes are controlled such that a readout circuit 1 reads the collected charges $Q_1$ in a phase synchronized with the emitted light pulses, and a readout circuit 2 reads the collected charges $Q_2$ in an opposite phase with the emitted light pulses. In some implementations, the distance, D, between the imaging system 1800 and the target object 1810 may be derived using the equation $$D = \frac{c}{4f_m} \frac{Q_2}{Q_1 + Q_2},$$

where c is the speed of light.

Figure 18C:
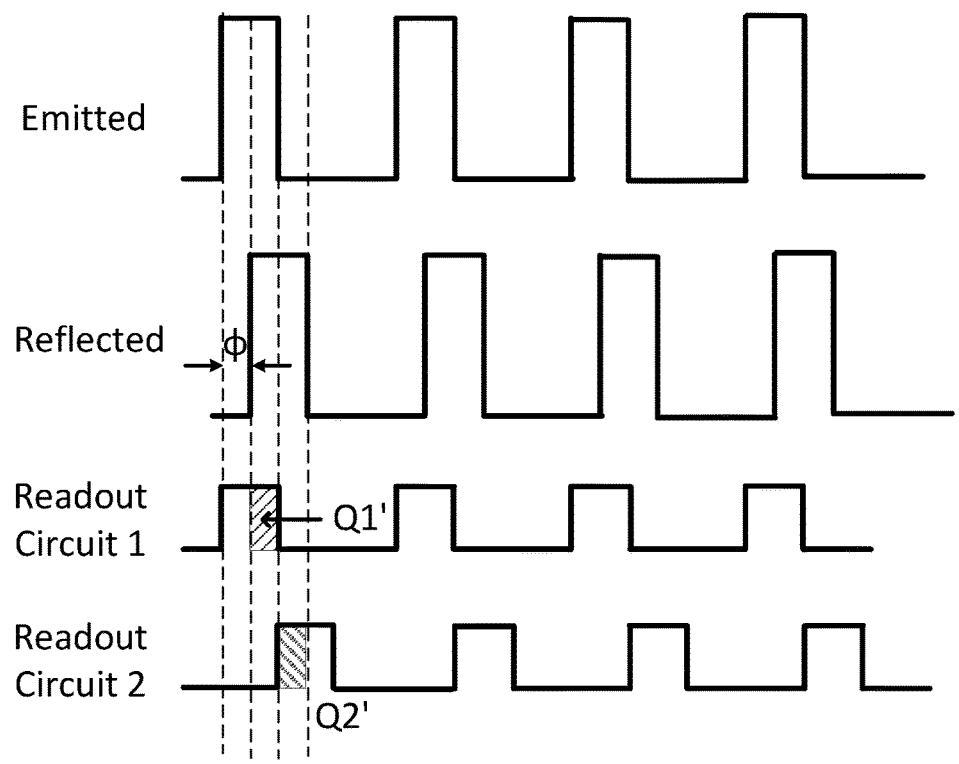

FIG. 18C shows another example technique for determining characteristics of the target object 1810. The transmitter unit 1802 may emit light pulses 1812 modulated at a frequency $f_m$ with a duty cycle of less than 50%. By reducing the duty cycle of the optical pulses by a factor of N, but increasing the intensity of the optical pulses by a factor of N at the same time, the signal-to-noise ratio of the received reflected light pulses 1814 may be improved while maintaining substantially the same power consumption for the imaging system 1800. This is made possible when the device bandwidth is increased so that the duty cycle of the optical pulses can be decreased without distorting the pulse shape. The receiver unit 1804 may receive reflected light pulses 1814 having a phase shift of Φ. The multi-gate photodiodes are controlled such that a readout circuit 1 reads the collected charges in a phase synchronized with the emitted light pulses, and a readout circuit 2 reads the collected charges $Q_2'$ in a delayed phase with the emitted light pulses. In some implementations, the distance, D, between the imaging system 1800 and the target object 1810 may be derived using the equation $$D = \frac{c}{4Nf_m} \frac{Q_2'}{Q_1' + Q_2'}.$$

Figure 19:
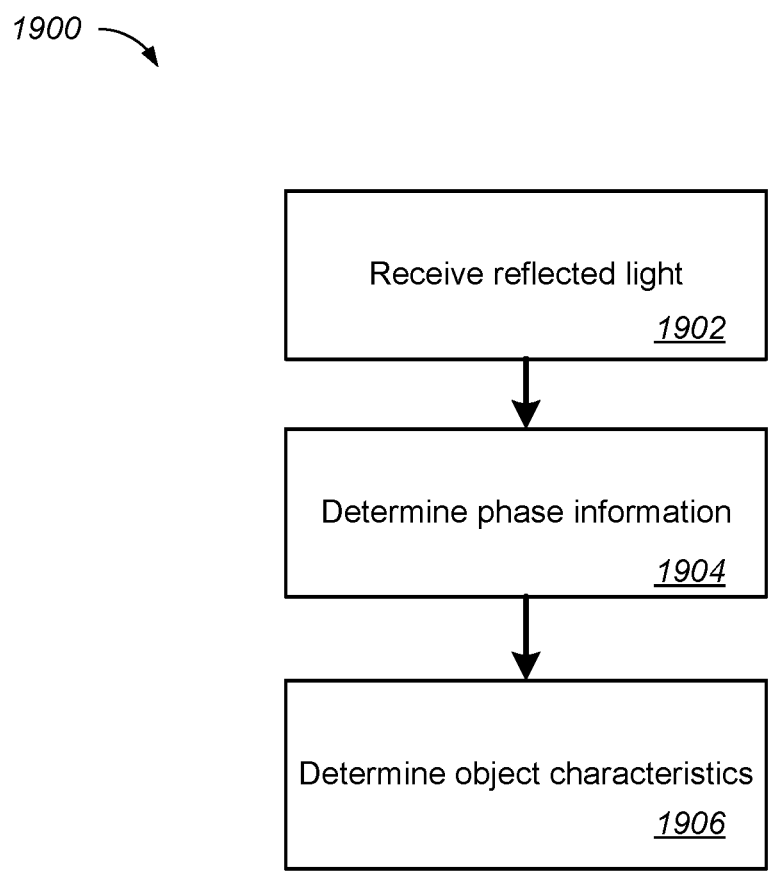
FIG. 19 shows an example of a flow diagram for determining characteristics of an object using an imaging system.

FIG. 19 shows an example of a flow diagram 1900 for determining characteristics of an object using an imaging system. The process 1900 may be performed by a system such as the imaging system 1800.

The system receives reflected light (1902). For example, the transmitter unit 1802 may emit NIR light pulses 1812 towards the target object 1810. The receiver unit 1804 may receive the reflected NIR light pulses 1814 that is reflected from the target object 1810.

The system determines phase information (1904). For example, the receiver unit 1804 may include an image sensor, where the image sensor includes multiple pixels fabricated on a semiconductor substrate. Each pixel may include one or more photodiodes for detecting the reflected light pulses 1814. The type of photodiodes may be the multi-gate photodiodes disclosed in this patent application, where the phase information may be determined using techniques described in reference to FIG. 18B or FIG. 18C.

The system determines object characteristics (1906). For example, the processing unit 1806 may determine depth information of the object 1810 based on the phase information using techniques described in reference to FIG. 18B or FIG. 18C.

A number of implementations have been described. Nevertheless, it will be understood that various modifications may be made without departing from the spirit and scope of the disclosure. For example, various forms of the flows shown above may be used, with steps re-ordered, added, or removed.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. A method for fabricating an image sensor array having a first group of photodiodes for detecting light at visible wavelengths, and a second group of photodiodes for detecting light at infrared or near-infrared wavelengths, the method comprising:
    forming a germanium-silicon layer for the second group of photodiodes on a first semiconductor donor wafer;
    defining a first interconnect layer on the germanium-silicon layer, wherein the first interconnect layer includes a plurality of interconnects configured to be coupled to the first group of photodiodes and the second group of photodiodes;
    defining integrated circuitry for controlling pixels of the image sensor array on a semiconductor carrier wafer;
    after defining the integrated circuitry, defining a second interconnect layer on the semiconductor carrier wafer, wherein the second interconnect layer includes a plurality of interconnects coupled to the integrated circuitry;
    bonding the first interconnect layer with the second interconnect layer;
    defining the pixels of an image sensor array on a second semiconductor donor wafer;
    after defining the pixels of the image sensor array, defining a third interconnect layer on the image sensor array; and
    bonding the third interconnect layer with the germanium-silicon layer, such that the first group of photodiodes and the second group of photodiodes are coupled to the integrated circuitry.

2. The method of claim 1, further comprising:
after bonding the first interconnect layer with the second interconnect layer, removing the first semiconductor donor wafer.

3. The method of claim 1,
wherein forming the germanium-silicon layer for the second group of photodiodes on the first semiconductor donor wafer comprises growing a blanket layer of germanium-silicon on the first semiconductor donor wafer, and
wherein the method further comprises:
    after bonding the first interconnect layer with the second interconnect layer, defining regions for at least the second group of photodiodes on the germanium-silicon layer.

4. The method of claim 1,
wherein forming the germanium-silicon layer for the second group of photodiodes on the first semiconductor donor wafer comprises:
    depositing an insulating layer on the semiconductor donor wafer;
    defining, on the insulating layer, regions for the second group of photodiodes; and
    growing a germanium-silicon layer on the regions for the second group of photodiodes.

* * * * *